United States Patent
Fujii et al.

[11] Patent Number: 6,069,045
[45] Date of Patent: May 30, 2000

[54] METHOD OF FORMING C49-STRUCTURE TUNGSTEN-CONTAINING TITANIUM SALICIDE STRUCTURE

[75] Inventors: Kunihiro Fujii; Ken Inoue; Kuniko Miyakawa; Kaoru Mikagi, all of Tokyo, Japan

[73] Assignee: NEC Corporation, Tokyo, Japan

[21] Appl. No.: 09/213,437

[22] Filed: Dec. 17, 1998

Related U.S. Application Data

[62] Division of application No. 08/862,960, Jun. 2, 1997, Pat. No. 5,880,505.

[30] Foreign Application Priority Data

May 31, 1996 [JP] Japan ................................. 8-139050

[51] Int. Cl.[7] .............................................. H01L 21/336
[52] U.S. Cl. ...................... 438/303; 438/533; 438/649; 438/664; 438/683
[58] Field of Search ................................. 438/592, 630, 438/649, 664, 683, 303, 482, 533

[56] References Cited

U.S. PATENT DOCUMENTS

| | | | |
|---|---|---|---|
| 5,457,069 | 10/1995 | Chen et al. | 438/653 |
| 5,510,295 | 4/1996 | Cabral, Jr. et al. | 438/664 |
| 5,665,646 | 9/1997 | Kitano | 438/592 |
| 5,741,725 | 4/1998 | Inoue et al. | 438/649 |
| 5,750,437 | 5/1998 | Oda | 438/592 |
| 5,776,822 | 7/1998 | Fujii et al. | 438/586 |

FOREIGN PATENT DOCUMENTS 6-349771  12/1994  Japan .

OTHER PUBLICATIONS

S.E. Babcock et al., "Titanium–tungsten contacts to Si: The effects of alloying on Schottky contact and on silicide formation", J. Appl. Phys., vol. 53, No. 10, Oct. 1982, pp. 6898–6905.

T.P. Nolan et al., "Modeling of agglomeration in polycrystalline thin films: Application" J. Appl. Phys., vol. 71, No. 2, Jan. 15, 1992, pp. 720–724.

Z.G. Xiag et al., "TiSi$_2$ Thin Films Formed on Crystalline and Amorphous Silicon", Materials Research Society, Mat. Res. Soc. Symp. Proc., vol. 181, 1990, pp. 167–173.

*Primary Examiner*—T. N. Quach
*Attorney, Agent, or Firm*—Young & Thompson

[57] ABSTRACT

A C49-structured titanium silicide film contains at least a refractory metal having a higher melting point than titanium in the form of a substitutional solid solution, wherein a concentration of the refractory metal to a total amount of titanium and the refractory metal is in the range of above 1 at % to not more than 20 at %. On silicon, there is formed a titanium film which contains at least a refractory metal having a higher melting point than titanium, wherein a concentration of the refractory metal to a total amount of titanium and the refractory metal is in the range of above 1 at % to not more than 20 at %. The titanium film is then subjected to a heat treatment in an inert gas atmosphere for causing a silicidation reaction, thereby to form a C49-structured titanium silicide film which contains the above at least a refractory metal in the form of a substitutional solid solution.

50 Claims, 7 Drawing Sheets

0.1 μm

METHOD OF FORMING C49-STRUCTURE TUNGSTEN-CONTAINING TITANIUM SALICIDE STRUCTURE

CROSS-REFERENCE TO RELATED APPLICATIONS

This application is a division of application Ser. No. 08/862,960, filed Jun. 2, 1997, U.S. Pat. No. 5,880,505.

BACKGROUND OF THE INVENTION

The present invention relates to an improved C49-structured titanium salicide structure in semiconductor device, and method of forming the same.

Titanium is the most attractive refractory metal for silicidation reaction process as titanium silicide has a lowest electrical resistivity in any refractory metal suicides and improvement and development in titanium silicide are most important and receive a great deal of attention in the silicidation techniques.

A conventional method of forming titanium salicide structure over a silicon substrate will be described with reference to FIGS. 1A through 1E which are fragmentary cross sectional elevation views illustrative of fabrication processes for fabricating CMOS transistors having a titanium salicide structure over a silicon substrate.

With reference to FIG. 1A, an n-well region 2 is selectively formed in a p-type silicon substrate 1 by an ion-implantation of n-type impurity. Field oxide films 3 are selectively formed on a surface of the silicon substrate 1 by a local oxidation of silicon method. The filed oxide films 3 have a thickness of 300 nanometers. The filed oxide films 3 surround active regions on the n-well region 2 and the surface region of the p-type silicon substrate 1. Gate oxide films 4 are formed on the active regions on the n-well region 2 and the surface region of the p-type silicon substrate 1. The gate oxide films 4 have a thickness of 6 nanometers. A polysilicon film having a thickness of 150 nanometers is entirely formed, which extends over the field oxide films 3 and the gate oxide films 4. The polysilicon film is patterned by a photo-lithography method and a subsequent dry etching method to form gate electrodes 5 on the gate oxide films 4 formed on the active regions on the n-well region 2 and on the surface region of the p-type silicon substrate 1. By use of photolithography, an ion-implantation mask is formed over the n-well region 2 before lightly n-doped diffusion layers 14 are formed in the surface region of the silicon substrate 1 by ion-implantation of n-type impurity in self-alignment. The ion-implantation mask is removed and thereafter by use of the photo-lithography, another ion-implantation mask is formed over the surface region of the silicon substrate 1 before lightly p-doped diffusion layers 15 are formed in the surface region of the n-well region 2 by ion-implantation of p-type impurity in self-alignment. The other ion-implantation mask is removed. As a modification, it is, of course, available that the lightly p-doped diffusion layers 15 have been formed before the lightly n-doped diffusion layers 14 are formed. A silicon oxide film having a thickness of 70 nanometers is entirely formed which extends over the filed oxide films 3, the lightly n-doped diffusion layers 114, the lightly p-doped diffusion layers 15 and the gate electrodes 5. The silicon oxide film is then selectively removed by an etch back method to form side wall oxide films 6 at opposite sides of each of the gate electrodes 5.

With reference to FIG. 1B, still another ion-implantation mask is formed over the surface region of the n-well region 2 and the gate electrode 5 over the n-well region 2, before ion-implantation of p-type impurity into the surface region of the surface region of the silicon substrate 1 as well as into the gate electrode 5 over the surface region of the silicon substrate 1 are carried out by self-alignment technique to thereby form an n-type polysilicon gate electrode 9 over the silicon substrate 1 and n-type source/drain diffusion layers 7 in the surface region of the silicon substrate 1. After the still other ion-implantation mask is removed, yet another ion-implantation mask is formed over the surface region of the silicon substrate 1 and the gate electrode 5 over the silicon substrate 1. Ion-implantation of p-type impurity into the n-well region 2 as well as into the gate electrode 5 over the n-well region 2 are carried out by self-alignment technique to thereby form a p-type polysilicon gate electrode 10 over the n-well region 2 and p-type source/drain diffusion layers 8 in the surface region of the n-well region 2. As a modification, it is, of course, possible that the p-type polysilicon gate electrode 10 and the p-type source/drain diffusion layers 8 have been formed before the n-type polysilicon gate electrode 9 and the n-type source/drain diffusion layers 7 are formed. Subsequently, the silicon substrate 1 is subjected to a heat treatment at a temperature of 900° C. for 20 minutes in a nitrogen atmosphere for recovery from crystal defects caused by ion-implantation and for activation of impurity doped thereinto. As a result, n-type source/drain diffusion layers 7 with lightly doped drain structure and p-type source/drain diffusion layers 8 with lightly doped drain structure are formed.

Spontaneous oxide films are removed by diluted fluorine acid solution from surfaces of the n-type and p-type polysilicon gate electrodes 9 and 10 as well as from surfaces of the n-type source/drain diffusion layers 7 and the p-type source/drain diffusion layers 8. Subsequently, a titanium film 11 is entirely deposited by sputtering a target of titanium. The titanium film 11 extends over the field oxide films 3, the n-type and p-type source/drain diffusion layers 7 and 8, the n-type and p-type polysilicon gate electrodes 9 and 10 and the side wall oxide films 6.

With reference to FIG. 1C, the silicon substrate 1 is subjected to a rapid thermal annealing at a temperature of 700° C. in a nitrogen atmosphere to cause silicidation reactions. The titanium film 11 in contact with the n-type and p-type source/drain diffusion layers 7 and 8 and the n-type and p-type polysilicon gate electrodes 9 and 10 shows silicidation reactions of titanium and tungsten with silicon or polysilicon. As a result, C49-structured titanium silicide films 12 are provided in self-alignment or salicidation technique so that the C49-structured titanium silicide films 12 extend over the n-type and p-type source/drain diffusion layers 7 and 8 and the n-type and p-type polysilicon gate electrodes 9 and 10. On the other hand, the titanium film 11 in contact with the field oxide films 3 and the side wall oxide films 6 as well as a surface region of the titanium film 11 show nitration reaction of titanium and tungsten with nitrogen. As a result, a titanium nitride film 13 is provided, which extends over the field oxide films 3 and the side wall oxide films 6 as well as over a surface of the C49-structured titanium silicide film 12.

With reference to FIG. 1D, only the titanium nitride films 13 are removed from the field oxide films 3 and the side wall oxide films 6 by a wet etching with a mixing solution of ammonia water and hydrogen peroxide water. The substrate is then subjected to a rapid thermal anneal at a temperature of 800° C. to cause a phase transition from C49-structure into C54-structure whereby the C49-structured titanium silicide film 12 is made into a C54-structured titanium silicide film 16. The C54-structured titanium silicide film 16 is lower in sheet resistance than the C49-structured titanium silicide film 12.

With reference to FIG. 1E, a first inter-layer insulator 17 made of silicon oxide is entirely deposited which extends over the C54-structured titanium silicide film 16, the field oxide films 3 and the side wall oxide films 6. Subsequently, a second inter-layer insulator 18 made of silicon oxide containing impurity such as boron or phosphorus is deposited over the first inter-layer insulator 17. The first and second inter-layer insulators 17 and 18 are annealed by a furnace-anneal at a temperature of 800°°C. The C54-structured titanium silicide films 16, however, show deformations into islands. As a result, the C54-structured titanium silicide films 16 vary in thickness and in sheet resistance. The averaged sheet resistance of the C54-structured titanium silicide films 16 post-annealed at 800° C. is increased.

In order to solve those problems, it was proposed to introduce oxygen and boron into the titanium silicide film by ion-implantation before titanium oxide and titanium borate are formed by post-anneal. Those techniques are disclosed in Japanese laid-open patent publication No. 3-80542 and reported in a meeting of Japan Applied Physics Society held in Autumn 1995.

However, the heat resistance of such titanium silicide film containing titanium oxide and/or titanium borate is insufficient.

It was known that, since C49-structured titanium silicide has a higher resistivity than C54-structured titanium silicide, in order to reduce a resistivity, it is effective to carry out a rapid thermal anneal at a high temperature of not less than 800° C. to cause a phase transition of C49-structure into C54-structure. The C54-structured titanium silicide has a larger grain size than the C49-structured titanium silicide. On the other hand, the C54-structured titanium silicide has a larger crystal grain size than the C49-structured titanium silicide the C54-structure, whilst the C54-structured titanium silicide titanium silicide has a lower heat resistance than the C49-structured titanium silicide. If the crystal grain size is increased, then the heat resistance is decreased. The C54-structured titanium silicide is more than 10 times larger in crystal grain size than the C49-structured titanium silicide. This means that the C54-structured titanium silicide is much inferior in heat resistance than the C49-structured titanium silicide. This was reported and is disclosed in Journal of Applied Physics 72(2), Jan. 15, 1992, pp. 720–724.

FIG. 2 is a photograph taken by transmission electron microscope and illustrative of C49-structure crystal grains and co-existent C54-structure crystal grains during a phase transition from C49-structure into C54-structure caused by a rapid thermal anneal at a temperature of 650° C. for 30 seconds after a titanium film of 40 nanometers in thickness has been deposited on amorphous silicon. Small crystal grains with fine stripe patterns caused by plane lattice defects or staking faults correspond to C49-structured crystal grains, whilst large crystal grains correspond to C54-structured crystal grains. If, in such case, the titanium film is deposited on amorphous silicon, a titanium silicidation reaction may be caused by a relatively low temperature. This was reported and is disclosed in Material Research Society Symposium Proceedings 1990 Vol. 181, pp. 167–172.

By the way, the titanium silicide structure or the titanium salicide structure may be applied to a semiconductor device such as MOS field effect transistor. In this case, after the titanium salicide structure has been formed over a silicon substrate, an inter-layer insulator is deposited over the titanium salicide structure and then the substrate or inter-lay insulator is subjected to an anneal at a high temperature of, for example, not less than 800° C. If, in order to obtain a reduced resistivity, the C54-structured titanium silicide were once formed over silicon or polysilicon regions over the silicon substrate, then the C54-structured titanium silicide is subjected to the anneal at a high temperature of not less than 800° C. Since, however, C54-structured titanium silicide film is inferior in heat resistance, the C54-structured titanium silicide film is likely to be deformed into islands or to be made largely vary in thickness. As a result, the deformed C54-structured titanium silicide film largely varies in sheet resistance. Particularly when the C54-structured titanium silicide film is used as a fine-structured interconnection having a reduced width, then the problems with deformation of the C54-structured titanium suicide film into the island like shape and with the variation in sheet resistance of the deformed C54-structured titanium silicide film would be more serious.

In the above circumstances, it had been required to develop a novel titanium silicide film which has a high heat-resistance and a low sheet resistance.

SUMMARY OF THE INVENTION

Accordingly, it is an object of the present invention to provide a titanium silicide film free from the problems as described above.

It is a further object of the present invention to provide a titanium silicide film which is highly heat-resistive.

It is a still further object of the present invention to provide a titanium silicide film which has a low sheet resistance.

It is yet a further object of the present invention to provide a titanium silicide film which is suitable for fine electrode or interconnection with a small width.

It is a further more object of the present invention to provide a titanium salicide structure free from the problems as described above.

It is moreover object of the present invention to provide a titanium silicide film which is highly heat-resistive.

It is still more further object of the present invention to provide a titanium salicide structure which has a low sheet resistance.

It is yet more object of the present invention to provide a titanium salicide structure which is suitable for fine electrode or interconnection with a small width.

It is another object of the present invention to provide a novel method of forming a titanium silicide film free from the problems as described above.

It is further another object of the present invention to provide a novel method of forming a titanium silicide film which is highly heat-resistive.

It is still another object of the present invention to provide a novel method of forming a titanium silicide film which has a low sheet resistance.

It is yet another object of the present invention to provide a novel method of forming a titanium silicide film which is suitable for fine electrode or interconnection with a small width.

It is an additional object of the present invention to provide a novel method of forming a titanium salicide structure free from the problems as described above.

It is a further additional object of the present invention to provide a novel method of forming a titanium silicide film which is highly heat-resistive.

It is still further additional further object of the present invention to provide a novel method of forming a titanium salicide structure which has a low sheet resistance.

It is yet further additional object of the present invention to provide a novel method of forming a titanium salicide structure which is suitable for fine electrode or interconnection with a small width.

The above and other objects, features and advantages of the present invention will be apparent from the following descriptions.

The present invention provides a C49-structured titanium silicide film which contains at least a refractory metal having a higher melting point than titanium in the form of a substitutional solid solution, wherein a concentration of the refractory metal to a total amount of titanium and the refractory metal is in the range of above 1 at % to not more than 20 at %.

The present invention also provides a titanium salicide structure comprising a first C49-structured titanium silicide film self-aligned on a polysilicon gate electrode, and second C49-structured titanium silicide films self-aligned on source/drain diffusion regions, wherein each of the first and second C49-structured titanium silicide films contains at least a refractory metal having a higher melting point than titanium in the form of a substitutional solid solution, and wherein a concentration of the refractory metal to a total amount of titanium and the refractory metal is in the range of above 1 at % to not more than 20 at %.

The present invention also provides a method of forming a C49-structured titanium silicide film on silicon. On silicon, there is formed a titanium film which contains at least a refractory metal having a higher melting point than titanium, wherein a concentration of the refractory metal to a total amount of titanium and the refractory metal is in the range of above 1 at % to not more than 20 at %. The titanium film is then subjected to a heat treatment in an inert gas atmosphere for causing a silicidation reaction, thereby to form a C49-structured titanium silicide film which contains the above at least a refractory metal in the form of a substitutional solid solution.

The present invention also provides a method of forming a titanium salicide structure over a silicon substrate. Thick insulation films are selectively formed over a silicon substrate so that the thick insulation films surround an active region of the silicon substrate. A gate insulation film is formed on the active region of the silicon substrate. A polysilicon gate electrode is formed on the gate insulation film. Source drain diffusion regions are self-aligned in the silicon substrate. Side wall insulation films are formed at opposite sides of the polysilicon gate electrode. A titanium film is deposited which extends over the thick insulation film, the side wall insulation films, the polysilicon gate electrode and the source/drain diffusion regions. The titanium film contains at least a refractory metal having a higher melting point than titanium, wherein a concentration of the refractory metal to a total amount of titanium and the refractory metal is in the range of above 1 at % to not more than 10 at %. The titanium film is subjected to a heat treatment at a temperature of 690° C. in an inert gas atmosphere for causing a silicidation reaction, thereby to form a first C49-structured titanium silicide film self-aligned on the polysilicon gate electrode and second C49-structured titanium silicide films self-aligned on the source/drain diffusion regions whilst the titanium film extending over the thick insulation films and the side wall insulation films shows no silicidation reaction as well as a part of the titanium film extending over the polysilicon gate electrode and the source/drain diffusion regions shows no silicidation reaction. The titanium film having shown no silicidation reaction is removed by a wet etching. An inter-layer insulator is deposited which extends over the first and second C49-structured titanium silicide films, the thick insulation films and the side wall insulation films. The inter-layer insulator and the first and second C49-structured titanium silicide films are subjected to an anneal at a temperature of nor less than 800° C. whereas each of the first and second C49-structured titanium silicide films has a sheet resistance of not more than 60 $\mu\Omega$cm, and shows no phase transition.

BRIEF DESCRIPTIONS OF THE DRAWINGS

Preferred embodiments of the present invention will be described in detail with reference to the accompanying drawings.

Figure 1A:
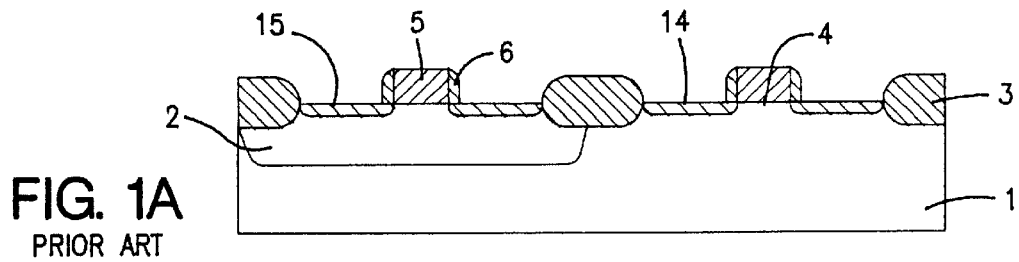
FIGS. 1A through 1E are fragmentary cross sectional elevation views illustrative of the conventional fabrication processes for fabricating CMOS transistors having a titanium salicide structure over a silicon substrate.
Figure 1B:
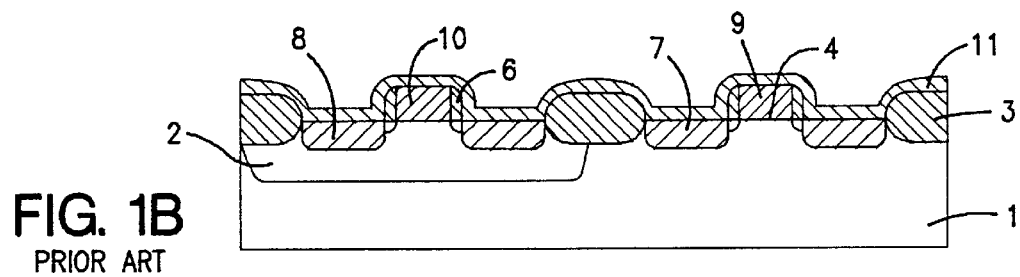
Figure 1C:
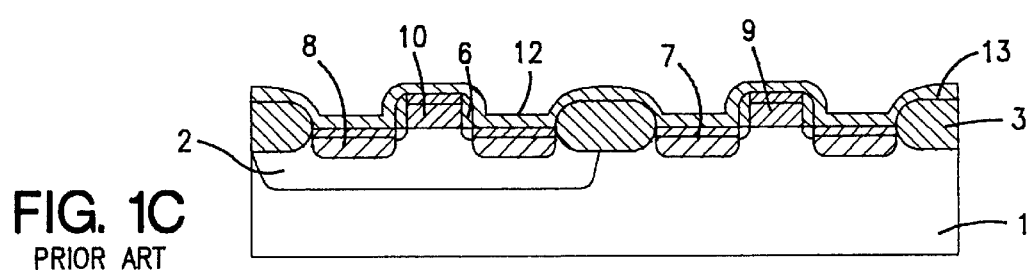
Figure 1D:
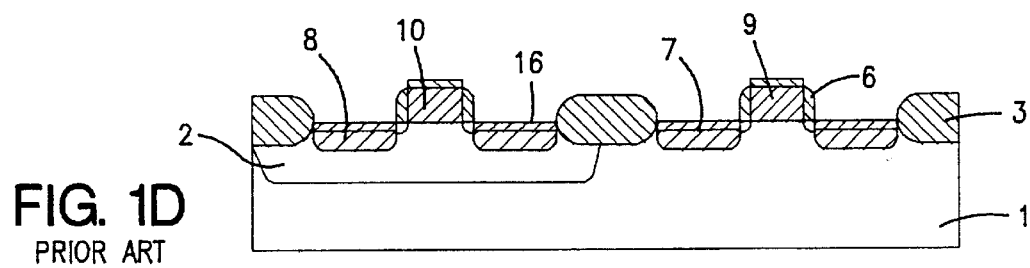
Figure 1E:
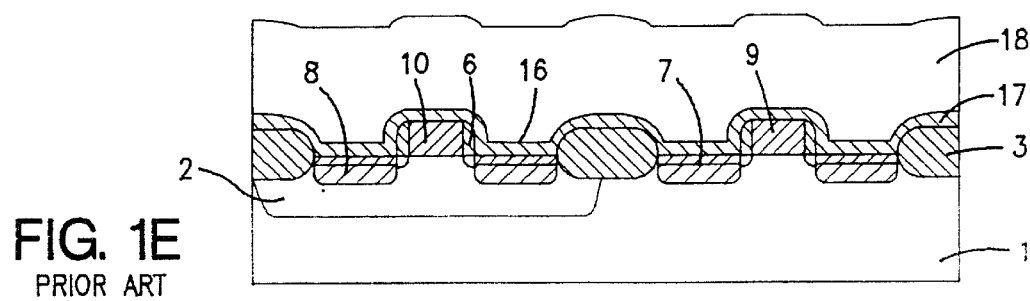
Figure 2:
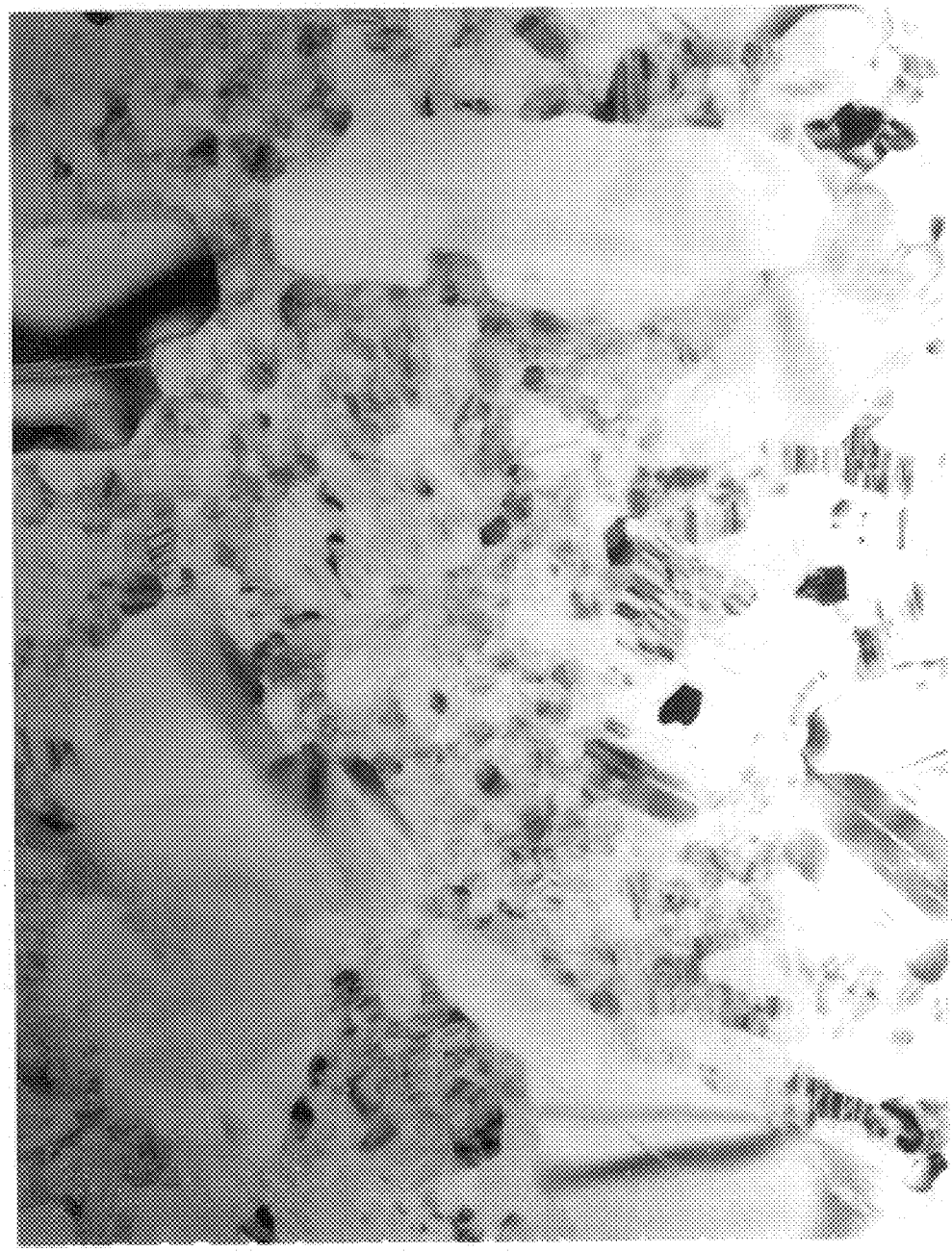
FIG. 2 is a photograph taken by transmission electron microscope and illustrative of C49-structure crystal grains and co-existent C54-structure crystal grains during a phase transition from C49-structure into C54-structure caused by a rapid thermal anneal at a temperature of 650° C. for 30 seconds after a titanium film of 40 nanometers in thickness has been deposited on amorphous silicon.
Figure 3:
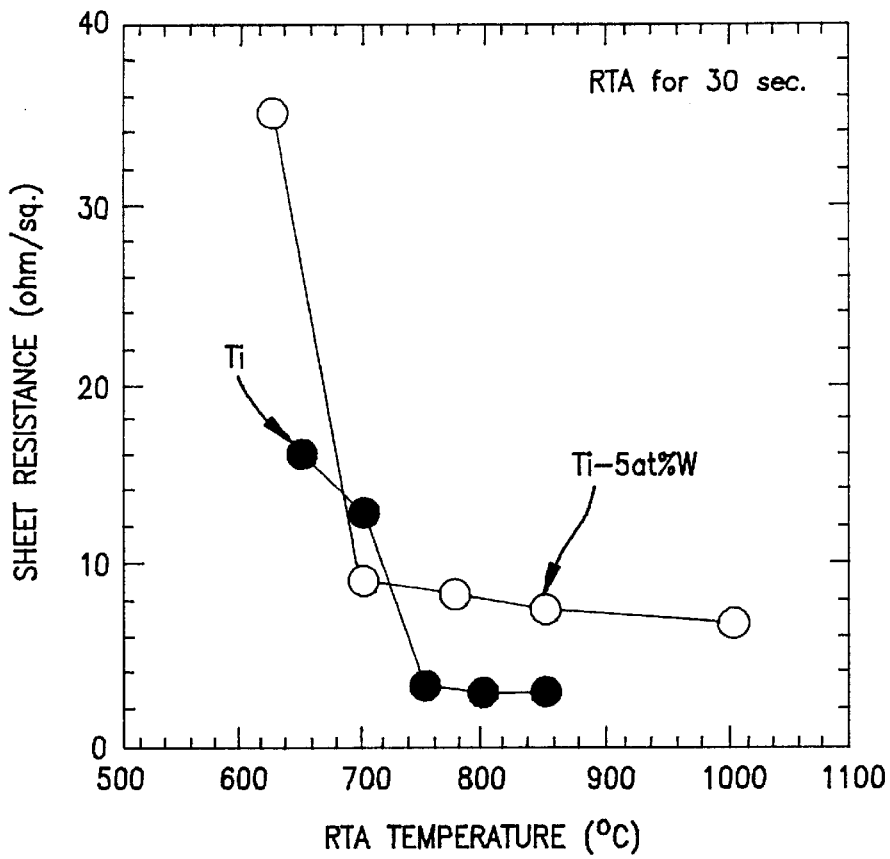

FIG. 3 is a diagram illustrative of variations in sheet resistance of a titanium suicide film and a 5 at %-tungsten containing titanium silicide film versus temperatures of a rapid thermal anneal used for causing silicidation reaction of titanium and 5 at %-tungsten containing titanium, wherein both a titanium film free of tungsten and a titanium film containing tungsten at a 5 at % concentration of tungsten to a total amount of titanium and tungsten are subjected to a rapid thermal anneal at various temperatures for 30 seconds.

Figure 4:
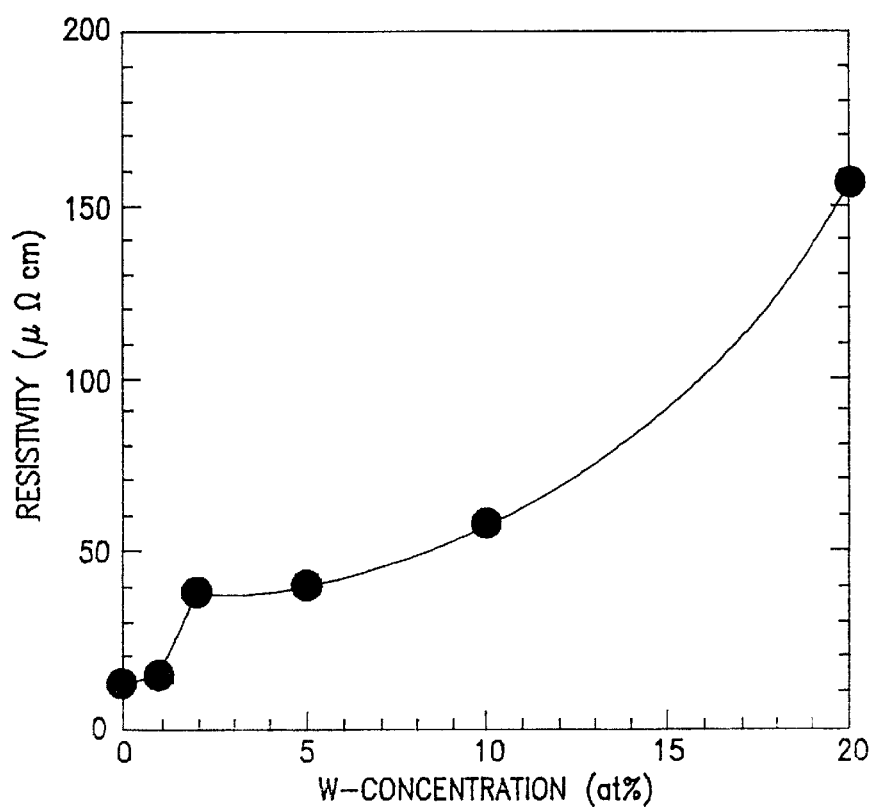

FIG. 4 is a diagram illustrative of variations in resistivity of tungsten containing titanium silicide film versus concentrations in atomic percent of tungsten to a total amount of titanium and tungsten, wherein tungsten is present in the form of substitutional solid solution, namely titanium atoms in the C49-structured titanium silicide are substituted or replaced by tungsten atoms at various atomic percents.

Figure 5:
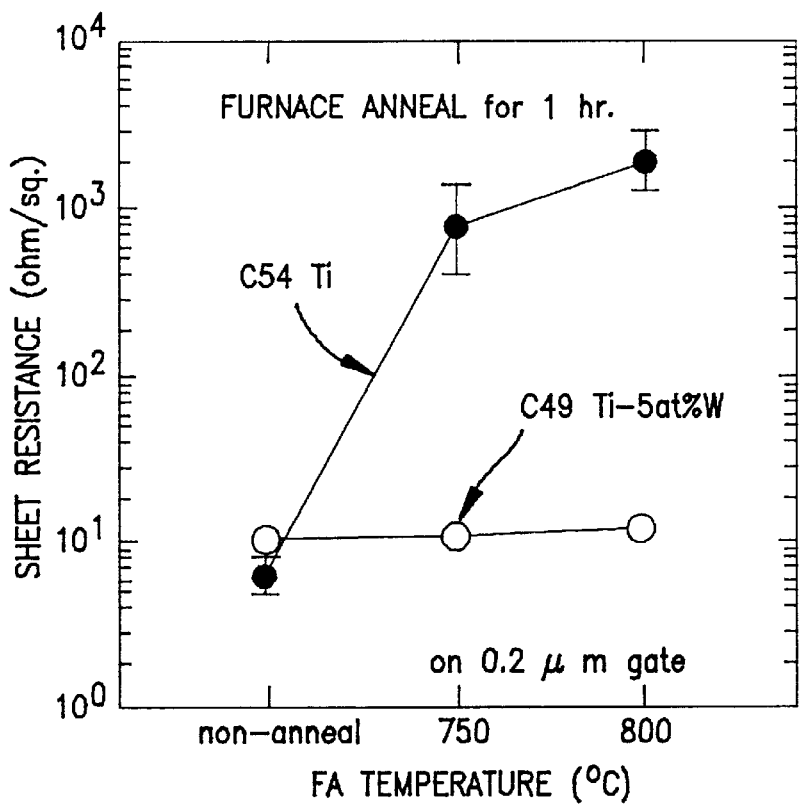

FIG. 5 is a diagram illustrative of sheet resistances of the C49-structured 5 at %-tungsten containing titanium suicide films and the tungsten free C54-structured titanium silicide films non-annealed and furnace-annealed for 1 hour at temperatures of 750° C. and 800° C. to an inter-layer insulator extending over them, after the both silicide films have been formed on n-type gate electrodes having a width of 0.2 $\mu$m.

Figure 6:
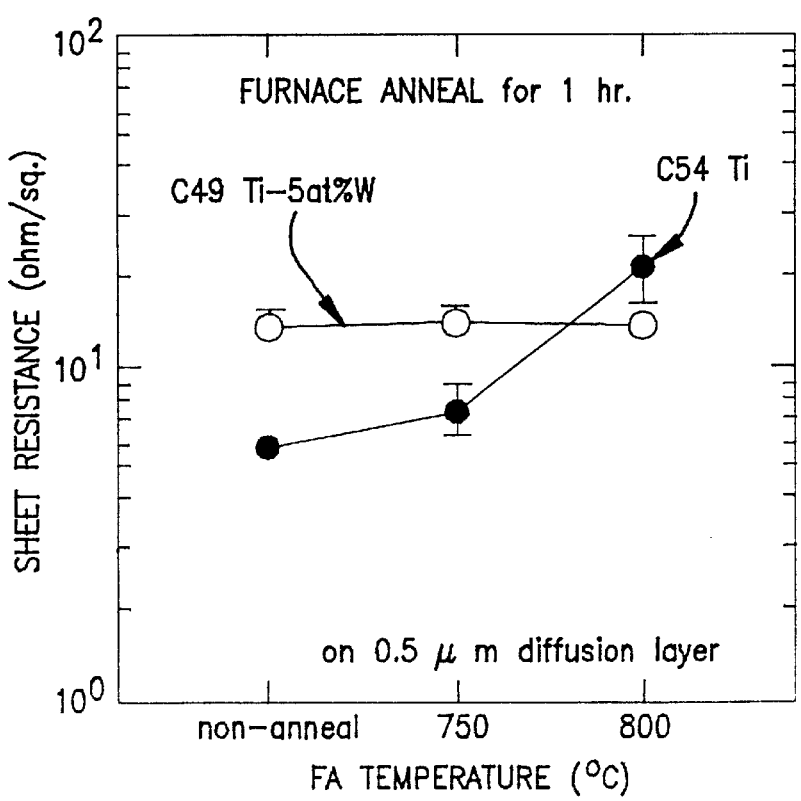

FIG. 6 is a diagram illustrative of sheet resistances of the C49-structured 5 at %-tungsten containing titanium silicide films and the tungsten free C54-structured titanium silicide films non-annealed and furnace-annealed for 1 hour at temperatures of 750° C. and 800° C. to an inter-layer insulator extending over them, after the both silicide films have been formed on n-type source/drain diffusion layers having a width of 0.5 $\mu$m.

FIGS. 7A through 7E are fragmentary cross sectional elevation views illustrative of fabrication processes for fabricating CMOS transistors having a tungsten containing titanium salicide structure over a silicon substrate in a first embodiment according to the present invention.

FIGS. 8A through 8F are fragmentary cross sectional elevation views illustrative of fabrication processes for fabricating CMOS transistors having a tungsten containing titanium salicide structure over a silicon substrate in a second embodiment according to the present invention.

FIGS. 9A through 9E which are fragmentary cross sectional elevation views illustrative of fabrication processes for fabricating CMOS transistors having a tungsten containing titanium salicide structure over a silicon substrate in a third embodiment according to the present invention.

DISCLOSURE OF THE INVENTION

The first present invention provides a C49-structured titanium silicide film which contains at least a refractory metal having a higher melting point than titanium in the form of a substitutional solid solution, wherein a concentration of the refractory metal to a total amount of titanium and the refractory metal is in the range of above 1 at % to not more than 20 at %.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten.

It is possible that the C49-structured titanium silicide film contains a plurality of refractory metals having higher melting points than titanium.

It is also possible that the C49-structured titanium silicide film shows no phase transition when the C49-structured titanium silicide film is subjected to a heat treatment of not less than 800° C.

It is also possible that the C49-structured titanium silicide film further contains an additional refractory metal having a lower melting point than titanium in the form of a substitutional solid solution, provided that the additional refractory metal has a lower concentration than the refractory metal having a higher melting point than titanium so that the C49-structured titanium silicide film remains highly heat-resistive and shows no deformation when the C49-structured titanium silicide film is subjected to a heat treatment of not less than 800° C.

It is preferable that the C49-structured titanium silicide film has a sheet resistance of not more than 50 $\mu\Omega$cm.

The second present invention provides a C49-structured titanium silicide film which contains at least a refractory metal having a higher melting point than titanium in the form of a substitutional solid solution, wherein the C49-structured titanium silicide film has a sheet resistance of not more than 60 $\mu\Omega$cm, and shows no phase transition when the C49-structured titanium silicide film is subjected to a heat treatment of not less than 800° C.

It is preferable that a concentration of the refractory metal to a total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten.

It is possible that the C49-structured titanium silicide film contains a plurality of refractory metals having higher melting points than titanium.

It is also possible that the C49-structured titanium silicide film further contains an additional refractory metal having a lower melting point than titanium in the form of a substitutional solid solution, provided that the additional refractory metal has a lower concentration than the refractory metal having a higher melting point than titanium so that the C49-structured titanium silicide film remains highly heat-resistive and shows no deformation when the C49-structured titanium silicide film is subjected to a heat treatment of not less than 800° C.

The third present invention provides a C49-structured titanium silicide film which contains at least a refractory metal having a higher melting point than titanium in the form of a substitutional solid solution, wherein a concentration of the refractory metal to a total amount of titanium and the refractory metal is not more than 20 at % so that the C49-structured titanium silicide film shows no phase transition when the C49-structured titanium silicide film is subjected to a heat treatment of not less than 800° C.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten.

It is possible that the C49-structured titanium silicide film contains a plurality of refractory metals having higher melting points than titanium.

It is also possible that the C49-structured titanium silicide film further contains an additional refractory metal having a lower melting point than titanium in the form of a substitutional solid solution, provided that the additional refractory metal has a lower concentration than the refractory metal having a higher melting point than titanium so that the C49-structured titanium silicide film remains highly heat-resistive and shows no deformation when the C49-structured titanium silicide film is subjected to a heat treatment of not less than 800° C.

It is preferable that the C49-structured titanium silicide film has a sheet resistance of not more than 50 $\mu\Omega$cm.

The fourth present invention provides a C49-structured titanium silicide film which contains tungsten in the form of a substitutional solid solution, wherein a concentration of tungsten to a total amount of titanium and tungsten is in the range of above 1 at % to not more than 10 at % so that the C49-structured titanium silicide film has a sheet resistance of not more than 50 $\mu\Omega$, and that the C49-structured titanium silicide film shows no phase transition when the C49-structured titanium silicide film is subjected to a heat treatment of not less than 800° C.

It is preferable that the concentration of tungsten to the total amount of titanium and tungsten is 5 at %.

The fifth present invention provides a titanium salicide structure comprising a first C49-structured titanium silicide film self-aligned on a polysilicon gate electrode, and second C49-structured titanium silicide films self-aligned on source/drain diffusion regions, wherein each of the first and second C49-structured titanium silicide films contains at least a refractory metal having a higher melting point than titanium in the form of a substitutional solid solution, and wherein a concentration of the refractory metal to a total amount of titanium and the refractory metal is in the range of above 1 at % to not more than 20 at %.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten.

It is possible that each of the first and second C49-structured titanium silicide films contains a plurality of refractory metals having higher melting points than titanium.

It is also preferable that each of the first and second C49-structured titanium silicide films shows no phase transition when each of the first and second C49-structured titanium silicide films is subjected to a heat treatment of not less than 800° C.

It is also possible that each of the first and second C49-structured titanium silicide films further contains an additional refractory metal having a lower melting point than titanium in the form of a substitutional solid solution, provided that the additional refractory metal has a lower concentration than the refractory metal having a higher melting point than titanium sow that each of the first and second C49-structured titanium silicide films shows no phase transition when each of the first and second C49-structured titanium silicide films is subjected to a heat treatment of not less than 800° C.

It is also preferable that each of the first and second C49-structured titanium silicide films has a sheet resistance of not more than 50 $\mu\Omega$cm.

The sixth present invention provides a titanium salicide structure comprising a first C49-structured titanium silicide film self-aligned on a polysilicon gate electrode, and second C49-structured titanium silicide films self-aligned on source/drain diffusion regions, wherein each of the first and second C49-structured titanium silicide films contains at least a refractory metal having a higher melting point than titanium in the form of a substitutional solid solution, and wherein each of the first and second C49-structured titanium silicide films has a sheet resistance of not more than 60 $\mu\Omega$cm, and shows no phase transition when each of the first and second C49-structured titanium silicide films is subjected to a heat treatment of not less than 800° C.

It is preferable that a concentration of the refractory metal to a total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten.

It is possible that each of the first and second C49-structured titanium silicide films contains a plurality of refractory metals having higher melting points than titanium.

It is also possible that each of the first and second C49-structured titanium silicide films further contains an additional refractory metal having a lower melting point than titanium in the form of a substitutional solid solution, provided that the additional refractory metal has a lower concentration than the refractory metal having a higher melting point than titanium.

The seventh present invention provides a titanium salicide structure comprising a first C49-structured titanium silicide film self-aligned on a polysilicon gate electrode, and second C49-structured titanium silicide films self-aligned on source/drain diffusion regions, wherein each of the first and second C49-structured titanium silicide films contains at least a refractory metal having a higher melting point than titanium in the form of a substitutional solid solution, and wherein a concentration of the refractory metal to a total amount of titanium and the refractory metal is not more than 20 at % so that each of the first and second C49-structured titanium silicide films shows no phase transition when each of the first and second C49-structured titanium silicide films is subjected to a heat treatment of not less than 800° C.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten.

It is possible that each of the first and second C49-structured titanium silicide films contains a plurality of refractory metals having higher melting points than titanium.

It is also possible that each of the first and second C49-structured titanium silicide films further contains an additional refractory metal having a lower melting point than titanium in the form of a substitutional solid solution, provided that the additional refractory metal has a lower concentration than the refractory metal having a higher melting point than titanium so that each of the first and second C49-structured titanium silicide films shows no phase transition when each of the first and second C49-structured titanium silicide films is subjected to a heat treatment of not less than 800° C.

It is also preferable that each of the first and second C49-structured titanium silicide films has a sheet resistance of not more than 50 $\mu\Omega$cm.

The eighth present invention provides a titanium salicide structure comprising a first C49-structured titanium silicide film self-aligned on a polysilicon gate electrode, and second C49-structured titanium silicide films self-aligned on source/drain diffusion regions, wherein each of the first and second C49-structured titanium silicide films contains tungsten in the form of a substitutional solid solution, and wherein a concentration of tungsten to a total amount of titanium and tungsten is in the range of above 1 at % to not more than 10 at % so that each of the first and second C49-structured titanium silicide films has a sheet resistance of not more than 50 $\mu\Omega$, and that each of the first and second C49-structured titanium silicide films shows no phase transition when each of the first and second C49-structured titanium silicide films is subjected to a heat treatment of not less than 800° C.

It is preferable that the concentration of tungsten to the total amount of titanium and tungsten is 5 at %.

The ninth present invention provides a method of forming a C49-structured titanium silicide film on silicon. On silicon, there is formed a titanium film which contains at least a refractory metal having a higher melting point than titanium, wherein a concentration of the refractory metal to a total amount of titanium and the refractory metal is in the range of above 1 at % to not more than 20 at %. The titanium film is then subjected to a heat treatment in an inert gas atmosphere for causing a silicidation reaction, thereby to form a C49-structured titanium silicide film which contains the above at least a refractory metal in the form of a substitutional solid solution.

It is preferable that the titanium film which contains the above at least a refractory metal is formed by the step of depositing, on a monocrystal silicon by a sputtering method, a titanium film which contains the above at least a refractory metal, wherein a concentration of the refractory metal to a total amount of titanium and the refractory metal is in the range of above 1 at % to not more than 20 at %.

It is also preferable that the titanium film which contains the above at least a refractory metal is formed by the steps of depositing a titanium film on a monocrystal silicon by a sputtering method, and introducing the above at least a refractory metal into the titanium film by an ion-implantation so that a concentration of the refractory metal to a total amount of titanium and the refractory metal is in the range of above 1 at % to not more than 20 at %.

It is also preferable that the titanium film which contains the above at least a refractory metal is formed by the step of depositing, on a polycrystal silicon by a sputtering method, a titanium film which contains the above at least a refractory metal, wherein a concentration of the refractory metal to a total amount of titanium and the refractory metal is in the range of above 1 at % to not more than 20 at %.

It is also preferable that the titanium film which contains the above at least a refractory metal is formed by the steps of depositing a titanium film on a polycrystal silicon by a sputtering method, and introducing the above at least a refractory metal into the titanium film by an ion-implantation so that a concentration of the refractory metal to a total amount of titanium and the refractory metal is in the range of above 1 at % to not more than 20 at %.

It is also preferable that the titanium film which contains the above at least a refractory metal is subjected to a rapid thermal anneal at a temperature of 690° C. for 30 seconds.

It is also preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

The tenth present invention provides a method of forming a C49-structured titanium silicide film on silicon. On an amorphous silicon heated at a temperature of approximately 450° C., there is formed a titanium film which contains at least a refractory metal having a higher melting point than titanium, wherein a concentration of the refractory metal to a total amount of titanium and the refractory metal is in the range of above 1 at % to not more than 20 at %, for causing a silicidation reaction and a crystallization of amorphous silicon into silicon, thereby to form, on silicon, a C49-structured titanium silicide film which contains the above at least a refractory metal in the form of a substitutional solid solution.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

The silicidation reaction at the lower substrate temperature of 450° C. forms a the C49-structured titanium silicide film containing the refractory metal and having a lower sheet resistance than when the refractory metal containing titanium film is deposited on the silicon or polysilicon layer and then annealed by rapid thermal anneal at a higher temperature of, for example, 690° C.

The eleventh present invention provides a method of forming a C49-structured titanium silicide film on silicon. On silicon, there is provided a titanium film which contains at least a refractory metal having a higher melting point than titanium, wherein a concentration of the refractory metal to a total amount of titanium and the refractory metal is in the range of above 1 at % to not more than 20 at %. The titanium film is subjected to a heat treatment in an inert gas atmosphere for causing a silicidation reaction, thereby to form a C49-structured titanium silicide film which contains the above at least a refractory metal in the form of a substitutional solid solution. An inter-layer insulator is formed on the C49-structured titanium silicide film. The interlayer insulator and the C49-structured titanium silicide film are subjected to an anneal at a temperature of not less than 800° C. whereas the C49-structured titanium silicide film has a sheet resistance of not more than 60 $\mu\Omega$cm, and shows no phase transition.

It is preferable that the titanium film which contains the above at least a refractory metal is formed by the step of depositing, on a monocrystal silicon by a sputtering method, a titanium film which contains the above at least a refractory metal, wherein a concentration of the refractory metal to a total amount of titanium and the refractory metal is in the range of above 1 at % to not more than 20 at %.

It is also preferable that the titanium film which contains the above at least a refractory metal is formed by the step of depositing a titanium film on a monocrystal silicon by a sputtering method, and introducing the above at least a refractory metal into the titanium film by an ion-implantation so that a concentration of the refractory metal to a total amount of titanium and the refractory metal is in the range of above 1 at % to not more than 20 at %.

It is also preferable that the titanium film which contains the above at least a refractory metal is formed by the step of depositing, on a polycrystal silicon by a sputtering method, a titanium film which contains the above at least a refractory metal, wherein a concentration of the refractory metal to a total amount of titanium and the refractory metal is in the range of above 1 at % to not more than 20 at %.

It is also preferable that the titanium film which contains the above at least a refractory metal is formed by the steps of depositing a titanium film on a polycrystal silicon by a sputtering method, and introducing the above at least a refractory metal into the titanium film by an ion-implantation so that a concentration of the refractory metal to a total amount of titanium and the refractory metal is in the range of above 1 at % to not more than 20 at %.

It is also preferable that the titanium film which contains the above at least a refractory metal is subjected to a rapid thermal anneal at a temperature of 690° C. for 30 seconds.

It is also preferable that a concentration of the refractory metal to a total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

The twelfth present invention provides a method of forming a C49-structured titanium silicide film on silicon. On an amorphous silicon heated at a temperature of approximately 450° C., there is formed a titanium film which contains at least a refractory metal having a higher melting point than titanium, for causing a silicidation reaction and a crystallization of amorphous silicon into silicon, thereby to form, on silicon, a C49-structured titanium silicide film which contains the above at least a refractory metal in the form of a substitutional solid solution. An inter-layer insulator is deposited on the C49-structured titanium silicide film. The inter-layer insulator and the C49-structured titanium silicide film are subjected to an anneal at a temperature of not less than 800° C. whereas the C49-structured titanium silicide film has a sheet resistance of not more than 60 $\mu\Omega$cm, and shows no phase transition.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

The silicidation reaction at the lower substrate temperature of 450° C. forms a the C49-structured titanium silicide film containing the refractory metal and having a lower sheet resistance than when the refractory metal containing titanium film is deposited on the silicon or polysilicon layer and then annealed by rapid thermal anneal at a higher temperature of, for example, 690° C.

The thirteenth present invention provides a method of forming a C49-structured titanium silicide film on silicon. On silicon, there is formed a titanium film which contains at least a refractory metal having a higher melting point than titanium, wherein a concentration of the refractory metal to a total amount of titanium and the refractory metal is not more than 20 at %. The titanium film is subjected to a heat treatment in an inert gas atmosphere for causing a silicidation reaction, thereby to form a C49-structured titanium silicide film which contains the above at least a refractory metal in the form of a substitutional solid solution. An interlayer insulator is deposited on the C49-structured titanium silicide film. The inter-layer insulator and the C49-structured titanium silicide film are subjected to an anneal at a temperature of not less than 800° C. whereas the C49-structured titanium silicide film shows no phase transition.

It is preferable that the titanium film which contains the above at least a refractory metal is formed by the step of depositing, on a monocrystal silicon by a sputtering method, a titanium film which contains the above at least a refractory metal, wherein a concentration of the refractory metal to a total amount of titanium and the refractory metal is in the range of above 1 at % to not more than 20 at %.

It is also preferable that the titanium film which contains the above at least a refractory metal is formed by the step of depositing a titanium film on a monocrystal silicon by a sputtering method, and introducing the above at least a refractory metal into the titanium film by an ion-implantation so that a concentration of the refractory metal to a total amount of titanium and the refractory metal is in the range of above 1 at % to not more than 20 at %.

It is also preferable that the titanium film which contains the above at least a refractory metal is formed by the step of depositing, on a polycrystal silicon by a sputtering method, a titanium film which contains the above at least a refractory metal, wherein a concentration of the refractory metal to a total amount of titanium and the refractory metal is in the range of above 1 at % to not more than 20 at %.

It is also preferable that the titanium film which contains the above at least a refractory metal is subjected to a rapid thermal anneal at a temperature of 690° C. for 30 seconds.

It is also preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

The fourteenth present invention provides a method of forming a C49-structured titanium silicide film on silicon. On an amorphous silicon heated at a temperature of approximately 450° C., there is formed a titanium film which contains at least a refractory metal having a higher melting point than titanium, wherein a concentration of the refractory metal to a total amount of titanium and the refractory metal is not more than 20 at %, for causing a silicidation reaction and a crystallization of amorphous silicon into silicon, thereby to form, on silicon, a C49-structured titanium silicide film which contains the above at least a refractory metal in the form of a substitutional solid solution. An inter-layer insulator is deposited on the C49-structured titanium silicide film. The inter-layer insulator and the C49-structured titanium silicide film are subjected to an anneal at a temperature of not less than 800° C. whereas the C49-structured titanium silicide film shows no phase transition.

It is preferable that the concentration of the refractory metal to the total amount of titanium and the refractory metal is in the range of above 1 at % to not more than 10 at %.

It is more preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

The silicidation reaction at the lower substrate temperature of 450° C. forms a the C49-structured titanium silicide film containing the refractory metal and having a lower sheet resistance than when the refractory metal containing titanium film is deposited on the silicon or polysilicon layer and then annealed by rapid thermal anneal at a higher temperature of, for example, 690° C.

The fifteenth present invention provides a method of forming a titanium salicide structure over a silicon substrate. Thick insulation films are selectively formed over a silicon substrate so that the thick insulation films surround an active region of the silicon substrate. A gate insulation film is formed on the active region of the silicon substrate. A polysilicon gate electrode is formed on the gate insulation film. Source drain diffusion regions are self-aligned in the silicon substrate. Side wall insulation films are formed at opposite sides of the polysilicon gate electrode. A titanium film is deposited which extends over the thick insulation film, the side wall insulation films, the polysilicon gate electrode and the source/drain diffusion regions. The titanium film contains at least a refractory metal having a higher melting point than titanium, wherein a concentration of the refractory metal to a total amount of titanium and the refractory metal is in the range of above 1 at % to not more than 10 at %. The titanium film is subjected to a heat treatment at a temperature of 690° C. in an inert gas atmosphere for causing a silicidation reaction, thereby to form a first C49-structured titanium silicide film self-aligned on the polysilicon gate electrode and second C49-structured titanium silicide films self-aligned on the source/drain diffusion regions whilst the titanium film extending over the thick insulation films and the side wall insulation films shows no silicidation reaction as well as a part of the titanium film extending over the polysilicon gate electrode and the source/drain diffusion regions shows no silicidation reaction. The titanium film having shown no silicidation reaction is removed by a wet etching. An inter-layer insulator is deposited which extends over the first and second C49-structured titanium silicide films, the thick insulation films and the side wall insulation films. The inter-layer insulator and the first and second C49-structured titanium silicide films are subjected to an anneal at a temperature of nor less than 800° C. whereas each of the first and second C49-structured titanium silicide films has a sheet resistance of not more than 60 $\mu\Omega$cm, and shows no phase transition.

It is preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

It is also preferable that each of the first and second C49-structured titanium silicide films has a sheet resistance of not more than 50 $\mu\Omega$Cm.

The sixteenth present invention provides a method of forming a titanium salicide structure over a silicon substrate. Thick insulation films are selectively formed over a silicon substrate so that the thick insulation films surround an active region of the silicon substrate. A gate insulation film is formed on the active region of the silicon substrate. A polysilicon gate electrode is formed on the gate insulation film. Source drain diffusion regions are self-aligned in the silicon substrate. Side wall insulation films are formed at opposite sides of the polysilicon gate electrode. Amorphous silicon layers are formed in upper regions of the polysilicon gate electrode and the source/drain diffusion regions by an ion-implantation of an impurity having the same conductivity type of the source/drain diffusion regions and the polysilicon gate electrode into the upper regions. A titanium film is deposited which extends over the thick insulation film, the side wall insulation films and the amorphous silicon layers at a substrate temperature of approximately 450° C. for causing a silicidation reaction, wherein the titanium film which contains at least a refractory metal having a higher melting point than titanium, and wherein a concentration of the refractory metal to a total amount of titanium and the refractory metal is in the range of above 1 at % to not more than 10 at %, thereby to form a first C49-structured titanium silicide film self-aligned on the polysilicon gate electrode and second C49-structured titanium silicide films self-aligned on the source/drain diffusion regions whilst the titanium film extending over the thick insulation films and the side wall insulation films shows no silicidation reaction as well as a part of the titanium film extending over the polysilicon gate electrode and the source/drain diffusion regions shows no silicidation reaction. The titanium film having shown no silicidation reaction is removed by a wet-etching. An inter-layer insulator is deposited which extends over the first and second C49-structured titanium silicide films, the thick insulation films and the side wall insulation films. The inter-layer insulator and the first and second C49-structured titanium silicide films are subjected to an anneal at a temperature of nor less than 800° C. whereas each of the first and second C49-structured titanium silicide films has a sheet resistance of not more than 60 $\mu\Omega$cm, and shows no phase transition.

It is preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

It is also preferable that each of the first and second C49-structured titanium silicide films has a sheet resistance of not more than 50 $\mu\Omega$cm. The silicidation reaction at the lower substrate temperature of 450° C. forms a the C49-structured titanium silicide film containing the refractory metal and having a lower sheet resistance than when the refractory metal containing titanium film is deposited on the silicon or polysilicon layer and then annealed by rapid thermal anneal at a higher temperature of, for example, 690° C.

The seventeenth present invention provides a method of forming a titanium salicide structure over a silicon substrate. Thick insulation films are selectively formed over a silicon substrate so that the thick insulation films surround an active region of the silicon substrate. A gate insulation film is formed on the active region of the silicon substrate. A polysilicon gate electrode is formed on the gate insulation film. Source drain diffusion regions are self-aligned in the silicon substrate. Side wall insulation films are formed at opposite sides of the polysilicon gate electrode. A titanium film is deposited which extends over the thick insulation film, the side wall insulation films, the polysilicon gate electrode and the source/drain diffusion regions. An ion-implantation is carried out of at least a refractory metal having a higher melting point than titanium into the titanium film so that the titanium film contains the above at least a refractory metal, wherein a concentration of the refractory metal to a total amount of titanium and the refractory metal is in the range of above 1 at % to not more than 10 at %. The titanium film is subjected to a heat treatment at a temperature of 690° C. in an inert gas atmosphere for causing a silicidation reaction, thereby to form a first C49-structured titanium silicide film selfaligned on the polysilicon gate electrode and second C49-structured titanium silicide films self-aligned on the source/drain diffusion regions whilst the titanium film extending over the thick insulation films and the side wall insulation films shows no silicidation reaction as well as a part of the titanium film extending over the polysilicon gate electrode and the source/drain diffusion regions shows no silicidation reaction. The titanium film having shown no silicidation reaction is removed by a wet-etching. An inter-layer insulator is deposited which extends over the first and second C49-structured titanium silicide films, the thick insulation films and the side wall insulation films. The inter-layer insulator and the first and second C49-structured titanium silicide films are subjected to an anneal at a temperature of nor less than 800° C. whereas each of the first and second C49-structured titanium silicide films has a sheet resistance of not more than 60 $\mu\Omega$cm, and shows no phase transition.

It is preferable that the concentration of the refractory metal to the total amount of titanium and the refractory metal is 5 at %.

It is also preferable that the refractory metal is tungsten. In this, case, it is possible that the tungsten-containing titanium silicide film is deposited by sputtering a target of tungsten titanium alloy for uniform distribution of tungsten into titanium silicide films in the form of substitutional solid solution.

It is also preferable that each of the first and second C49-structured titanium silicide films has a sheet resistance of not more than 50 $\mu\Omega$cm.

It was known that, since C49-structured titanium silicide has a higher resistivity than C54-structured titanium silicide, in order to reduce a resistivity, it is effective to carry out a rapid thermal anneal at a high temperature of not less than 800° C. to cause a phase transition of C49-structure into C54-structure. The C54-structured titanium silicide has a larger grain size than the C49-structured titanium silicide. On the other hand, the C54-structured titanium silicide has a larger crystal grain size than the C49-structured titanium silicide the C54-structure, whilst the C54-structured titanium silicide titanium silicide has a lower heat resistance than the C49-structured titanium silicide. If the crystal grain size is increased, then the heat resistance is decreased. The C54-structured titanium silicide is more than 10 times larger in crystal grain size than the C49-structured titanium silicide. This means that the C54-structured titanium silicide is much inferior in heat resistance than the C49-structured titanium silicide.

By the way, the titanium silicide structure or the titanium salicide structure may be applied to a semiconductor device such as MOS field effect transistor. In this case, after the titanium salicide structure has been formed over a silicon substrate, an inter-layer insulator is deposited over the titanium salicide structure and then the substrate or inter-lay insulator is subjected to an anneal at a high temperature of, for example, not less than 800° C. If, in order to obtain a reduced resistivity, the C54-structured titanium silicide were once formed over silicon or polysilicon regions over the silicon substrate, then the C54-structured titanium silicide is subjected to the anneal at a high temperature of not less than 800° C. Since, however, C54-structured titanium silicide film is inferior in heat resistance, the C54-structured titanium silicide film is likely to be deformed into islands or to be made largely vary in thickness. As a result, the deformed C54-structured titanium silicide film largely varies in sheet resistance. Particularly when the C54-structured titanium silicide film is used as a fine-structured interconnection having a reduced width, then the problems with deformation of the C54-structured titanium silicide film into the island like shape and with the variation in sheet resistance of the deformed C54-structured titanium silicide film would be more serious.

On the other hand, the C49-structured titanium silicide film has a sufficiently high heat resistance, notwithstanding, the C49-structured titanium silicide film is highly resistive.

By contrast, in accordance with the above first to seventeenth present inventions, a C49-structured titanium silicide film is provided which, however, contains at least a refractory metal having a higher melting point than titanium in the form of a substitutional solid solution, wherein a concentration of the refractory metal to a total amount of titanium and the refractory metal is in the range of above 1 at % to not more than 20 at %. Preferably, the concentration of the refractory metal to the total amount of titanium and the refractory metal is in the range of above 1 at % to not more than 10 at %. More preferably, the concentration of the refractory metal to the total amount of titanium and the refractory metal is 5 at %. Also preferably, the refractory metal is tungsten. Notwithstanding, molybdenum is also available. Further, niobium, zirconium, tantalum, hafnium, rhenium, osmium, iridium, rhodium and vanadium and other refractory metals having a higher melting point than titanium are also available. The refractory metal contained in the C49-structured titanium silicide film in the form of the substitutional solid solution at the above concentration above 1 at % is capable of maintaining the C49-structure when the C49-structured titanium silicide film and an inter-layer insulator extending over the C49-structured titanium silicide film are annealed at a high temperature of not less than 800° C. This means that the C49-structured titanium silicide film containing the refractory metal in the above concentration is highly heat-resistive and available as a fine interconnection or electrode having a reduced width. This allows the semiconductor device to be scaled down remarkably and to possess high speed and high frequency performances as a result of the silicidation or salicidation technique.

If, contrary to the above present inventions, C49-structured titanium silicide film free of refractory metals were annealed at a high temperature of not less than 800° C., then a phase transition is caused so that C49-structure is changed to C54-structure. Since as described above the C54-structure is low in heat resistance, then the C54-structured titanium silicide film nay be deformed into island like shapes so that the deformed C54-structured titanium silicide film largely varies in thickness.

FIG. 3 is a diagram illustrative of variations in sheet resistance of a titanium silicide film and a 5 at %-tungsten containing titanium silicide film versus temperatures of a rapid thermal anneal used for causing silicidation reaction of titanium and 5 at %-tungsten containing titanium, wherein both a titanium film free of tungsten and a titanium film containing tungsten at a 5 at % concentration of tungsten to a total amount of titanium and tungsten are subjected to a rapid thermal anneal at various temperatures for 30 seconds. Sheet resistances of the tungsten free titanium silicide film are represented by "●" and sheet resistances of the 5 at %-tungsten containing titanium silicide film are represented by "○".

The sheet resistances "●" of the tungsten free titanium silicide film are dropped from 16 $\Omega/\square$ at 650° C. to 13 $\Omega/\square$ at 700° C., and rapidly dropped from 13 $\Omega/\square$ at 700° C. to 4 $\Omega/\square$ at 750° C. but substantially remain unchanged at 4 $\Omega/\square$ in the range of 750° C. through 850° C. Namely, the sheet resistance of the tungsten free titanium silicide film is largely dropped to 4 $\Omega/\square$ at 750° C. This means that the tungsten free titanium silicide films formed by silicidation reactions at low rapid thermal anneal temperatures of less than 750° C. have C49-structure, whilst tungsten free titanium silicide films formed by silicidation reactions at high rapid thermal anneal temperatures of not less than 750° C. have C54-structure. This further means that the tungsten free titanium silicide film shows the phase transition from C49-structure to C54-structure when subjected to the rapid thermal anneal at about 750° C.

By contrast, the sheet resistances "○" of the 5 at %-tungsten containing titanium silicide film are rapidly dropped from 35 Ω/□ at 620° C. to 9 Ω/□ at 700° C., but gradually and slightly dropped from 9 Ω/□ through 7 Ω/□ in the range of 700° C. through 1000° C. Namely, the sheet resistance of the 5 at %-tungsten containing titanium silicide film is never dropped largely to near 5 Ω/□ even if the temperature of the rapid thermal anneal is increased to 1000° C. This means that the 5 at %-tungsten containing titanium silicide films formed by silicidation reactions in the range of 700° C. through 1000° C. have C49-structure not never have C54-structure. This was also confirmed by a transmission electron microscope and X-ray diffraction method that the 5 at %-tungsten containing titanium silicide films formed by silicidation reactions in the range of 700° C. through 1000° C. have C49-structure wherein tungsten is contained in crystal grains or tungsten is present in the form of substitutional solid solution, namely 5 at % of titanium atoms in the C49-structured titanium silicide are substituted or replaced by tungsten atoms, and the 5 at %-tungsten containing titanium silicide films formed by silicidation reactions in the range of 700° C. through 1000° C. has no C54-structure. This further means that the C49-structured 5 at %-tungsten containing titanium silicide film shows no phase transition from C49-structure to C54-structure even when subjected to the higher rapid thermal anneal at 1000° C. This suggests that the 5 at %-tungsten containing titanium silicide films post-annealed in the range of 700° C. through 1000° C. show no phase transition from C49-structure to C54-structure nor variations in thickness and compositions. Namely, the 5 at %-tungsten containing titanium silicide film is highly heat-resistive.

FIG. 4 is a diagram illustrative of variations in resistivity of tungsten containing titanium silicide film versus concentrations in atomic percent of tungsten to a total amount of titanium and tungsten, wherein tungsten is present in the form of substitutional solid solution, namely titanium atoms in the C49-structured titanium silicide are substituted or replaced by tungsten atoms at various atomic percents. The tungsten containing titanium silicide film is formed by silicidation reaction caused by a rapid thermal anneal at a temperature of not less than 800° C.

As can be understood from FIG. 4, the resistivity of the tungsten containing titanium silicide film largely depends upon and is highly sensitive to the concentration in atomic percent of tungsten to a total amount of titanium and tungsten. The resistivity of the tungsten containing titanium silicide film is below 20 μΩcm at 0 at % tungsten concentration and remains about 20 μΩcm at 1 at % tungsten concentration. The resistivity of the tungsten containing titanium silicide film is rapidly increased from about 20 μΩcm to 40 μΩcm in the range of 1–2 at % tungsten concentrations. The resistivity of the tungsten containing titanium silicide film is slightly increased but almost remains unchanged at about 40 μΩcm in the range of 2–5 at % tungsten concentrations. The resistivity of the tungsten containing titanium silicide film is gradually increased from about 40 μΩcm to about 60 μΩcm in the range of 5–10 at % tungsten concentrations. The resistivity of the tungsten containing titanium silicide film is largely increased from about 60 μΩcm to above 150 μΩcm in the range of 10–20 at % tungsten concentrations. When the tungsten concentration is not more than 8 at %, then the resistivity of the tungsten containing titanium silicide film is not more than 50 μΩcm.

As described above, at a tungsten concentration of not more than 1 at %, the resistivity of the tungsten containing titanium silicide film is extremely low, for example, below 20 μΩcm. This means that the tungsten containing titanium silicide film has C54-structure. Namely, the phase transition from C49-structure to C54-structure is caused by the high temperature anneal of not less than 800° C. when the tungsten concentration is not more than 1 at %. By contrast, at 2 at % tungsten concentration, the resistivity of the tungsten containing titanium silicide film is about 40 μΩcm. This means that the tungsten containing titanium silicide film has C49-structure. Namely, no phase transition from C49-structure to C54-structure is caused by the high temperature anneal of not less than 800° C. when the tungsten concentration is above 1 at %. In order to maintain C49-structure even at a rapid thermal anneal temperature of not less than 800° C., it is required that the tungsten concentration is above 1 at %. In the light of maintaining the C49-structure even at a higher rapid thermal anneal temperature, it is desirable to increase the concentration in atomic percent of tungsten to the total amount of titanium and tungsten as high as possible. On the other hand, in the light of reducing the resistivity of the tungsten containing titanium silicide film, however, it is desirable to decrease the concentration in atomic percent of tungsten to the total amount of titanium and tungsten as low as possible. In order to obtain not more than 160 μΩcm in resistivity of the tungsten containing titanium silicide film, it is required that the concentration in atomic percent of tungsten to the total amount of titanium and tungsten is not more than 20 at %. In order to obtain not more than 60 μΩcm in resistivity of the tungsten containing titanium silicide film, it is required that the concentration in atomic percent of tungsten to the total amount of titanium and tungsten is not more than 10 at %. In order to obtain not more than 50 μΩcm in resistivity of the tungsten containing titanium silicide film, it is required that the concentration in atomic percent of tungsten to the total amount of titanium and tungsten is not more than 8 at %. In the light of maintaining the C49-structure even at a higher rapid thermal anneal temperature, however, it is desirable to increase the concentration in atomic percent of tungsten to the total amount of titanium and tungsten as high as possible. Accordingly, in the lights of both maintaining the C49-structure even at a higher rapid thermal anneal temperature and reducing the resistivity of the tungsten containing titanium suicide film, the concentration in atomic percent of tungsten to the total amount of titanium and tungsten is optimum at about 5 at %. It was known that tungsten is capable of suppressing the titanium silicidation reaction. This is disclosed in Journal of Applied Physics 53(10), October 1982. If, therefore, the concentration in atomic percent of tungsten to the total amount of titanium and tungsten is not less than 60 at %, then it is no longer possible to form the required tungsten containing titanium silicide film having a uniform thickness. Namely, at not less than 60 at % of the tungsten concentration, the tungsten containing titanium silicide film is deformed and largely varies in thickness and in sheet resistance. Such tungsten containing titanium silicide film is unavailable. Further, if the concentration in atomic percent of tungsten to the total amount of titanium and tungsten is not less than 80 at %, then it is no longer possible to form the required tungsten containing titanium silicide film having a uniform composition. Namely, at not less than 80 at % of the tungsten concentration, the tungsten containing titanium silicide film is not only deformed and largely varies in thickness and in sheet resistance but also varies in composition over position.

In this case, tungsten silicide regions and titanium silicide regions are separately formed. Locally, either tungsten silicide or titanium silicide is formed. Namely, the tungsten containing titanium silicide film is not the substitutional solid solution. Such tungsten containing titanium silicide film is, of course, unavailable. In order to obtain the required tungsten containing titanium silicide film being uniform both in thickness and composition, it is required that the concentration in atomic percent of tungsten to the total amount of titanium and tungsten is not more than 20 at %.

In the lights of obtaining both the reduction in resistivity of the tungsten containing titanium silicide film in the form of substitutional solid solution and highly heat-resistivity to the necessary high temperature anneal for annealing the inter-layer insulator extending over the tungsten containing titanium silicide film, the concentration of tungsten to the total amount of tungsten and titanium in the tungsten containing titanium silicide is available in the range of above 1 at % to 20 at %, and preferably in the range of above 1 at % to 10 at %, and more preferably in the range of above 1 at % to 8 at %, and further optimally at about 5 at %.

The foregoing descriptions with reference to FIGS. 3 and 4 are commonly applicable to when, in place of tungsten, another refractory metal having a higher melting point than titanium is contained in the C49-structured titanium silicide film in the form of substitutional solid solution, provided that since other refractory metals differ in melting point and in resistivity from tungsten, the difference in melting point of other refractory metal from tungsten may provide a slight influence to the available range in concentration of refractory metal to a total amount of refractory metal and titanium. As long as the refractory metal is not largely different in melting point and in resistivity from tungsten, substantially no change is caused in the above-described available range in concentration of refractory metal to a total amount of refractory metal and titanium. Titanium has a lower resistivity in the refractory metals, for which reason it is, however, preferable that the concentration of the refractory metal is as low as possible in order to keep a lower resistivity of the refractory metal containing titanium silicide, in the light of which refractory metals having higher melting points such as tungsten are preferable.

As can be understood from the above descriptions, it is also possible that the C49-structured titanium silicide film contains a plurality of refractory metals having higher melting points than titanium in the form of a substitutional solid solution.

It is further possible that the C49-structured titanium silicide film further contains an additional refractory metal having a lower melting point than titanium in the form of a substitutional solid solution, provided that the additional refractory metal has a lower concentration than the refractory metal having a higher melting point than titanium so that the C49-structured titanium silicide film remains highly heat-resistive and shows no deformation when the C49-structured titanium silicide film is subjected to a heat treatment of not less than 800° C.

FIG. 5 is a diagram illustrative of sheet resistances of the C49-structured 5 at %-tungsten containing titanium silicide films and the tungsten free C54-structured titanium silicide films non-annealed and furnace-annealed for 1 hour at temperatures of 750° C. and 800° C. to an inter-layer insulator extending over them, after the both silicide films have been formed on n-type gate electrodes having a width of 0.2 μm. The sheet resistances of the C49-structured 5 at %-tungsten containing titanium silicide films are represented by "○" whilst the sheet resistances of the tungsten free C54-structured titanium silicide films are represented by "●".

The sheet resistance of the tungsten free C54-structured titanium silicide film non-annealed is about 6 Ω/□, whilst the sheet resistances of the C49-structured 5 at %-tungsten containing titanium silicide film is about 10 Ω/□. When non-annealed, the tungsten free C54-structured titanium silicide film is lower in sheet resistance than the C49-structured 5 at %-tungsten containing titanium silicide film.

The sheet resistance of the tungsten free C54-structured titanium silicide film furnace-annealed at a temperature of 750° C. for 1 hour is about 800 Ω/□, whilst the sheet resistances of the C49-structured 5 at %-tungsten containing titanium silicide film furnace-annealed at a temperature of 750° C. for 1 hour remains just above 10 Ω/□. When furnace-annealed at 750° C. for 1 hour, the tungsten free C54-structured titanium silicide film is much higher in sheet resistance than the C49-structured 5 at %-tungsten containing titanium silicide film. Of the tungsten free C54-structured titanium silicide film, the sheet resistance is rapidly increased by furnace-anneal at 750° C. for 1 hour. This means that the tungsten free C54-structured titanium silicide film having a width of 0.2 μm is deformed into island like shapes by the furnace-anneal at 750° C., for 1 hour as the tungsten free C54-structured titanium silicide film is lowly heat-resistive. The tungsten free C54-structured titanium silicide film after annealed largely varies in thickness and sheet resistance. By contrast, of the C49-structured 5 at %-tungsten containing titanium silicide film, the sheet resistance is slightly increased or almost unchanged by furnace-anneal at 750° C. for 1 hour. This means that the C49-structured 5 at %-tungsten containing titanium silicide film having a width of 0.2 μm is not deformed by the furnace-anneal at 750° C. for 1 hour as the C49-structured 5 at %-tungsten containing titanium silicide film is highly heat-resistive. The C49-structured 5 at %-tungsten containing titanium silicide film still remains uniform in thickness and in sheet resistance.

The sheet resistance of the tungsten free C54-structured titanium silicide film furnace-annealed at a temperature of 800° C. for 1 hour is about 2000 Ω/□ whilst the sheet resistances of the C49-structured 5 at %-tungsten containing titanium silicide film furnace-annealed at a temperature of 750° C. for 1 hour still remains slightly above 10 Ω/□. When furnace-annealed at 800° C. for 1 hour, the tungsten free C54-structured titanium silicide film is extremely higher in sheet resistance than the C49-structured 5 at %-tungsten containing titanium silicide film. Of the tungsten free C54-structured titanium silicide film, the sheet resistance is rapidly increased by furnace-anneal at 800° C. for 1 hour. This means that the tungsten free C54-structured titanium silicide film having a width of 0.2 μm is remarkably deformed into island like shapes by the furnace-anneal at 800° C. for 1 hour as the tungsten free C54-structured titanium silicide film is lowly heat-resistive. The tungsten free C54-structured titanium silicide film after annealed largely varies in thickness and sheet resistance. By contrast, of the C49-structured 5 at %-tungsten containing titanium silicide film, the sheet resistance is slightly increased or almost unchanged by furnace-anneal at 800° C. for 1 hour. This means that the C49-structured 5 at %-tungsten containing titanium silicide film having a width of 0.2 μm is not deformed by the furnace-anneal at 750° C. for 1 hour as the C49-structured 5 at %-tungsten containing titanium silicide film is highly heat-resistive. The C49-structured 5 at %-tungsten containing titanium silicide film still remains uniform in thickness and in sheet resistance.

FIG. 6 is a diagram illustrative of sheet resistances of the C49-structured 5 at %-tungsten containing titanium silicide films and the tungsten free C54-structured titanium silicide films non-annealed and furnace-annealed for 1 hour at temperatures of 750° C. and 800° C. to an inter-layer insulator extending over them, after the both silicide films have been formed on n-type source/drain diffusion layers having a width of 0.5 μm. The sheet resistances of the C49-structured 5 at %-tungsten containing titanium silicide films are represented by "○" whilst the sheet resistances of the tungsten free C54-structured titanium silicide films are represented by "●".

The sheet resistance of the tungsten free C54-structured titanium silicide film non-annealed is below 6 Ω/□, whilst the sheet resistances of the C49-structured 5 at %-tungsten containing titanium silicide film is above 10 Ω/□. When non-annealed, the tungsten free C54-structured titanium silicide film is lower in sheet resistance than the C49-structured 5 at %-tungsten containing titanium silicide film.

The sheet resistance of the tungsten free C54-structured titanium silicide film furnace-annealed at a temperature of 800° C. for 1 hour is about 7 Ω/□, whilst the sheet resistances of the C49-structured 5 at %-tungsten containing titanium silicide film furnace-annealed at a temperature of 800° C. for 1 hour remains above 10 Ω/□. When furnace-annealed at 800° C. for 1 hour, the tungsten free C54-structured titanium silicide film is still lower in sheet resistance than the C49-structured 5 at %-tungsten containing titanium silicide film. Of the tungsten free C54-structured titanium silicide film, the sheet resistance is, however, increased by furnace-anneal at 800° C. for 1 hour. This means that the tungsten free C54-structured titanium silicide film having a width of 0.5 μm is deformed by the furnace-anneal at 800° C. for 1 hour as the tungsten free C54-structured titanium silicide film is lowly heat-resistive. The tungsten free C54-structured titanium silicide film after annealed varies in thickness and sheet resistance. By contrast, of the C49-structured 5 at %-tungsten containing titanium silicide film, the sheet resistance remains almost unchanged by furnace-anneal at 800° C. for 1 hour. This means that the C49-structured 5 at %-tungsten containing titanium silicide film having a width of 0.5 μm is not deformed by the furnace-anneal at 800° C. for 1 hour as the C49-structured 5 at %-tungsten containing titanium silicide film is highly heat-resistive. The C49-structured 5 at %-tungsten containing titanium silicide film still remains uniform in thickness and in sheet resistance.

The sheet resistance of the tungsten free C54-structured titanium silicide film furnace-annealed at a temperature of 800° C. for 1 hour is about 20 Ω/□, whilst the sheet resistances of the C49-structured 5 at %-tungsten containing titanium silicide film furnace-annealed at a temperature of 800° C. for 1 hour still remains above 10 Ω/□. When furnace-annealed at 800° C. for 1 hour, the tungsten free C54-structured titanium silicide film is higher in sheet resistance than the C49-structured 5 at %-tungsten containing titanium silicide film. Of the tungsten free C54-structured titanium silicide film, the sheet resistance is apparently increased by furnace-anneal at 800° C. for 1 hour. This means that the tungsten free C54-structured titanium silicide film having a width of 0.5 μm is deformed by the furnace-anneal at 800° C. for 1 hour as the tungsten free C54-structured titanium silicide film is lowly heat-resistive. The tungsten free C54-structured titanium silicide film after annealed varies in thickness and sheet resistance. By contrast, of the C49-structured 5 at %-tungsten containing titanium silicide film, the sheet resistance still remains unchanged by furnace-anneal at 800° C. for 1 hour. This means that the C49-structured 5 at %-tungsten containing titanium silicide film having a width of 0.5 μm is not deformed by the furnace-anneal at 750° C. for 1 hour as the C49-structured 5 at %-tungsten containing titanium silicide film is highly heat-resistive. The C49-structured 5 at %-tungsten containing titanium silicide film still remains uniform in thickness and in sheet resistance.

The foregoing descriptions with reference to FIGS. 5 and 6 are commonly applicable to when, in place of tungsten, another refractory metal having a higher melting point than titanium is contained in the C49-structured titanium silicide film in the form of substitutional solid solution, provided that since other refractory metals differ in melting point and in resistivity from tungsten, the difference in melting point and in resistivity of other refractory metal from tungsten may provide a slight influence to the available range in concentration of refractory metal to a total amount of refractory metal and titanium. As long as the refractory metal is not largely different in melting point and in resistivity from tungsten, substantially no change is caused in the above-described available range in concentration of refractory metal to a total amount of refractory metal and titanium. Titanium has a lower resistivity in the refractory metals, for which reason it is, however, preferable that the concentration of the refractory metal is as low as possible in order to keep a lower resistivity of the refractory metal containing titanium silicide, in the light of which refractory metals having higher melting points such as tungsten are preferable.

As can be understood from the above descriptions, it is also possible that the C49-structured titanium silicide film contains a plurality of refractory metals having higher melting points than titanium in the form of a substitutional solid solution.

It is further possible that the C49-structured titanium silicide film further contains an additional refractory metal having a lower melting point than titanium in the form of a substitutional solid solution, provided that the additional refractory metal has a lower concentration than the refractory metal having a higher melting point than titanium so that the C49-structured titanium silicide film remains highly heat-resistive and shows no deformation when the C49-structured titanium silicide film is subjected to a heat treatment of not less than 800° C.

In accordance with the foregoing present inventions described above, no rapid thermal annealing process is carried out at a high temperature of above 750° C. for causing a phase transition of C49-structure to C54-structure. This results in reductions in the number of manufacturing process and in manufacturing cost.

Further, in accordance with the tenth, twelfth, fourteenth, and sixteenth present inventions, an amorphous silicon region is first formed in an upper region of silicon or polysilicon layer by ion-implantation of an impurity having the same conductivity type of the silicon or polysilicon layer before a titanium film containing a refractory metal having a higher melting point than titanium such as tungsten is deposited on the amorphous silicon region over the silicon or polysilicon layer when heated at a substrate temperature of, for example, 450° C., so that not only the amorphous silicon is made into monocrystal or polycrystal silicon but also a silicidation reaction is caused at such low temperature thereby to form the C49-structured titanium silicide film containing the refractory metal having a higher melting point than titanium such as tungsten in the form of substitutional solid solution over the monocrystal or polycrystal silicon. The silicidation reaction at the lower substrate temperature of 450° C. forms a the C49-structured titanium silicide film containing the refractory metal and having a lower sheet resistance than when the refractory metal containing titanium film is deposited on the silicon or polysilicon layer and then annealed by rapid thermal anneal at a higher temperature of, for example, 690° C.

The foregoing first to seventeenth present inventions may of course be applicable to any semiconductor devices which need titanium silicide structures or titanium salicide structures.

PREFERRED EMBODIMENTS
First Embodiment

A first embodiment according to the present invention will be described with reference to FIGS. 7A through 7E which are fragmentary cross sectional elevation views illustrative of fabrication processes for fabricating CMOS transistors having a tungsten containing titanium salicide structure over a silicon substrate.

Figure 7A:
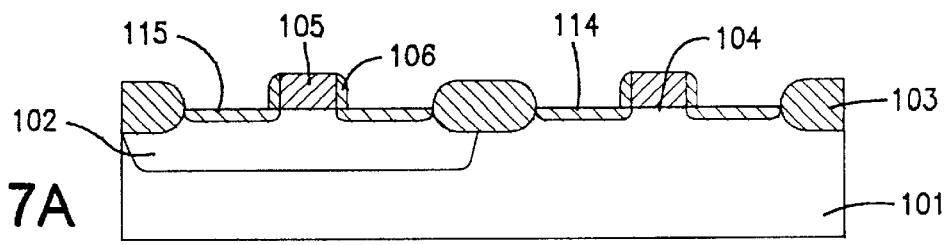

With reference to FIG. 7A, an n-well region 102 is selectively formed in a p-type silicon substrate 101 by an ion-implantation of n-type impurity. Field oxide films 103 are selectively formed on a surface of the silicon substrate 101 by a local oxidation of silicon method. The filed oxide films 103 have a thickness of 300 nanometers. The filed oxide films 103 surround active regions on the n-well region 102 and the surface region of the p-type silicon substrate 101. Gate oxide films 104 are formed on the active regions on the n-well region 102 and the surface region of the p-type silicon substrate 101. The gate oxide films 104 have a thickness of 6 nanometers. A polysilicon film having a thickness of 150 nanometers is entirely formed, which extends over the field oxide films 103 and the gate oxide films 104. The polysilicon film is patterned by a photo-lithography method and a subsequent dry etching method to form gate electrodes 105 on the gate oxide films 104 formed on the active regions on the n-well region 102 and on the surface region of the p-type silicon substrate 101. By use of photo-lithography, an ion-implantation mask is formed over the n-well region 102 before lightly n-doped diffusion layers 114 are formed in the surface region of the silicon substrate 101 by ion-implantation of n-type impurity in self-alignment. The ion-implantation mask is removed and thereafter by use of the photo-lithography, another ion-implantation mask is formed over the surface region of the silicon substrate 101 before lightly p-doped diffusion layers 115 are formed in the surface region of the n-well region 102 by ion-implantation of p-type impurity in self-alignment. The other ion-implantation mask is removed. As a modification, it is, of course, available that the lightly p-doped diffusion layers 115 have been formed before the lightly n-doped diffusion layers 114 are formed. A silicon oxide film having a thickness of 70 nanometers is entirely formed which extends over the filed oxide films 103, the lightly n-doped diffusion layers 114, the lightly p-doped diffusion layers 115 and the gate electrodes 105. The silicon oxide film is then selectively removed by an etch back method to form side wall oxide films 106 at opposite sides of each of the gate electrodes 105.

Figure 7B:
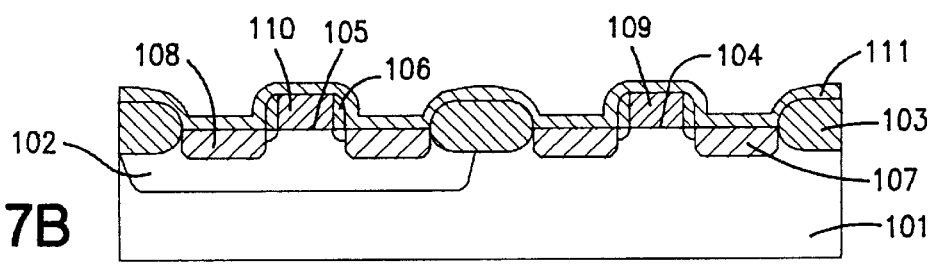

With reference to FIG. 7B, still another ion-implantation mask is formed over the surface region of the n-well region 102 and the gate electrode 105 over the n-well region 102, before ion-implantation of p-type impurity into the surface region of the surface region of the silicon substrate 101 as well as into the gate electrode 105 over the surface region of the silicon substrate 101 are carried out by self-alignment technique to thereby form an n-type polysilicon gate electrode 109 over the silicon substrate 101 and n-type source/drain diffusion layers 107 in the surface region of the silicon substrate 101. After the still other ion-implantation mask is removed, yet another ion-implantation mask is formed over the surface region of the silicon substrate 101 and the gate electrode 105 over the silicon substrate 101. Ion-implantation of p-type impurity into the n-well region 102 as well as into the gate electrode 105 over the n-well region 102 are carried out by self-alignment technique to thereby form a p-type polysilicon gate electrode 110 over the n-well region 102 and p-type source/drain diffusion layers 108 in the surface region of the n-well region 102. As a modification, it is, of course, possible that the p-type polysilicon gate electrode 110 and the p-type source/drain diffusion layers 108 have been formed before the n-type polysilicon gate electrode 109 and the n-type source/drain diffusion layers 107 are formed. Subsequently, the silicon substrate 101 is subjected to a heat treatment at a temperature of 900° C. for 20 minutes in a nitrogen atmosphere for recovery from crystal defects caused by ion-implantation and for activation of impurity doped thereinto. As a result, n-type source/drain diffusion layers 107 with lightly doped drain structure and p-type source/drain diffusion layers 108 with lightly doped drain structure are formed.

Spontaneous oxide films are removed by diluted fluorine acid solution from surfaces of the n-type and p-type polysilicon gate electrodes 109 and 110 as well as from surfaces of the n-type source/drain diffusion layers 107 and the p-type source/drain diffusion layers 108. Subsequently, a 5 at % tungsten containing titanium film 111 is entirely deposited by sputtering a target of titanium containing tungsten at a 5 at % concentration of tungsten to a total amount of tungsten and titanium. The 5 at % tungsten containing titanium film 111 extends over the field oxide films 103, the n-type and p-type source/drain diffusion layers 107 and 108, the n-type and p-type polysilicon gate electrodes 109 and 110 and the side wall oxide films 106. The 5 at % tungsten containing titanium film 111 is a titanium film containing tungsten at a 5 at % concentration of tungsten to a total amount of tungsten and titanium. The 5 at % tungsten containing titanium film 111 has a thickness of 30 nanometers.

Figure 7C:
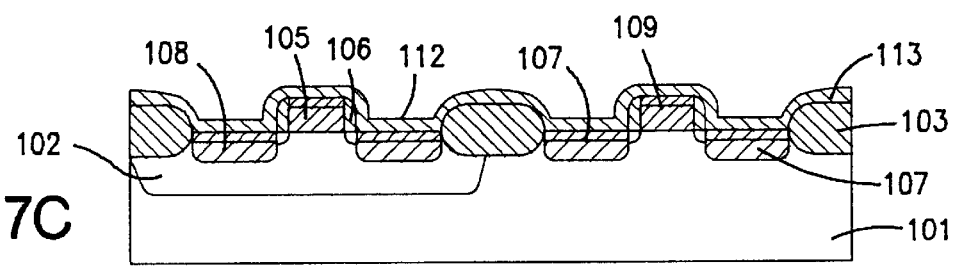

With reference to FIG. 7C, the silicon substrate 101 is subjected to a rapid thermal annealing at a temperature of 690° C. for 30 seconds in a nitrogen atmosphere to cause silicidation reactions. The 5 at % tungsten containing titanium film 111 in contact with the n-type and p-type source/drain diffusion layers 107 and 108 and the n-type and p-type polysilicon gate electrodes 109 and 110 shows silicidation reactions of titanium and tungsten with silicon or polysilicon. As a result, C49-structured titanium silicide films 112 containing tungsten at a 5 at % concentration of tungsten to a total amount of tungsten and titanium in the form of substitutional solid solution are provided in self-alignment or salicidation technique so that the C49-structured 5 at % tungsten containing titanium silicide films 112 extend over the n-type and p-type source/drain diffusion layers 107 and 108 and the n-type and p-type polysilicon gate electrodes 109 and 110. On the other hand, the 5 at % tungsten containing titanium film 111 in contact with the field oxide films 103 and the side wall oxide films 106 as well as a surface region of the 5 at % tungsten containing titanium film 111 show nitration reaction of titanium and tungsten with nitrogen. As a result, a titanium nitride film 113 containing tungsten is provided, which extends over the field oxide films 103 and the side wall oxide films 106 as well as over a surface of the C49-structured 5 at % tungsten containing titanium silicide film 112.

Figure 7D:
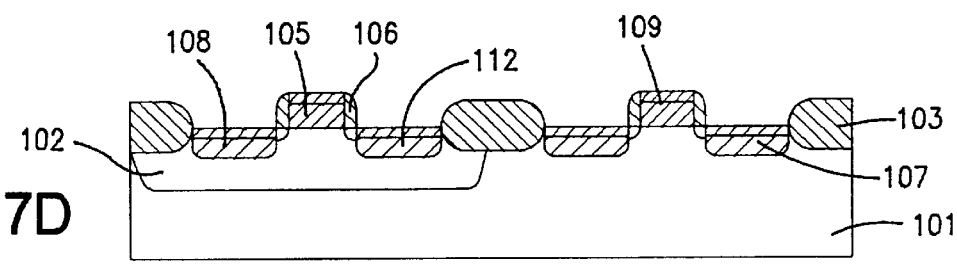

With reference to FIG. 7D, only the tungsten containing titanium nitride films 113 are removed from the field oxide films 103 and the side wall oxide films 106 by a wet etching with a mixing solution of ammonia water and hydrogen peroxide water.

Figure 7E:
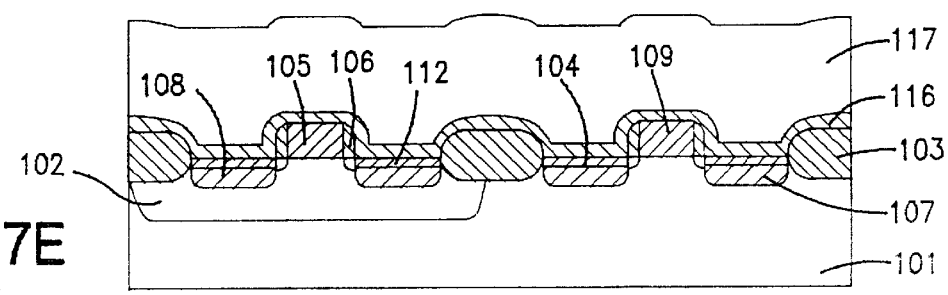

With reference to FIG. 7E, a first inter-layer insulator 116 made of silicon oxide is entirely deposited which extends over the C49-structured 5 at % tungsten containing titanium silicide films 112, the field oxide films 103 and the side wall oxide films 106. Subsequently, a second inter-layer insulator 117 made of silicon oxide containing impurity such as boron or phosphorus is deposited over the first inter-layer insulator 116. The first and second inter-layer insulators 116 and 117 are annealed by a furnace-anneal at a temperature of 800° C. The C49-structured 5 at %-tungsten containing titanium silicide films 112, however, show no phase transition from C49-structure to C54-structure as being highly heat-resistive. The C49-structured 5 at %-tungsten containing titanium silicide films 112 remain in C49-structure of titanium silicide containing tungsten in substitutional solid solution. The C49-structured 5 at %-tungsten containing titanium silicide films 112 show no variations in thickness and in composition nor deformation. The C49-structured 5 at %-tungsten containing titanium silicide films 112 remain uniform in thickness and in composition. The C49-structured 5 at %-tungsten containing titanium silicide films 112 remain low in sheet resistance.

Second Embodiment

A second embodiment according to the present invention will be described with reference to FIGS. 8A through 8F which are fragmentary cross sectional elevation views illustrative of fabrication processes for fabricating CMOS transistors having a tungsten containing titanium salicide structure over a silicon substrate.

Figure 8A:
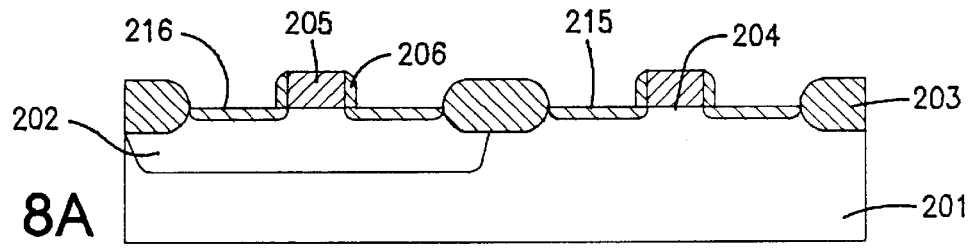

With reference to FIG. 8A, an n-well region 202 is selectively formed in a p-type silicon substrate 201 by an ion-implantation of n-type impurity. Field oxide films 203 are selectively formed on a surface of the silicon substrate 201 by a local oxidation of silicon method. The filed oxide films 203 have a thickness of 300 nanometers. The filed oxide films 203 surround active regions on the n-well region 202 and the surface region of the p-type silicon substrate 201. Gate oxide films 204 are formed on the active regions on the n-well region 202 and the surface region of the p-type silicon substrate 201. The gate oxide films 204 have a thickness of 6 nanometers. A polysilicon film having a thickness of 150 nanometers is entirely formed, which extends over the field oxide films 203 and the gate oxide films 204. The polysilicon film is patterned by a photo-lithography method and a subsequent dry etching method to form gate electrodes 205 on the gate oxide films 204 formed on the active regions on the n-well region 202 and on the surface region of the p-type silicon substrate 201. By use of photo-lithography, an ion-implantation mask is formed over the n-well region 202 before lightly n-doped diffusion layers 215 are formed in the surface region of the silicon substrate 201 by ion-implantation of n-type impurity in self-alignment. The ion-implantation mask is removed and thereafter by use of the photo-lithography, another ion-implantation mask is formed over the surface region of the silicon substrate 201 before lightly p-doped diffusion layers 216 are formed in the surface region of the n-well region 202 by ion-implantation of p-type impurity in self-alignment. The other ion-implantation mask is removed. As a modification, it is, of course, available that the lightly p-doped diffusion layers 216 have been formed before the lightly n-doped diffusion layers 215 are formed. A silicon oxide film having a thickness of 70 nanometers is entirely formed which extends over the filed oxide films 203, the lightly n-doped diffusion layers 215, the lightly p-doped diffusion layers 216 and the gate electrodes 205. The silicon oxide film is then selectively removed by an etch back method to form side wall oxide films 206 at opposite sides of each of the gate electrodes 205.

Figure 8B:
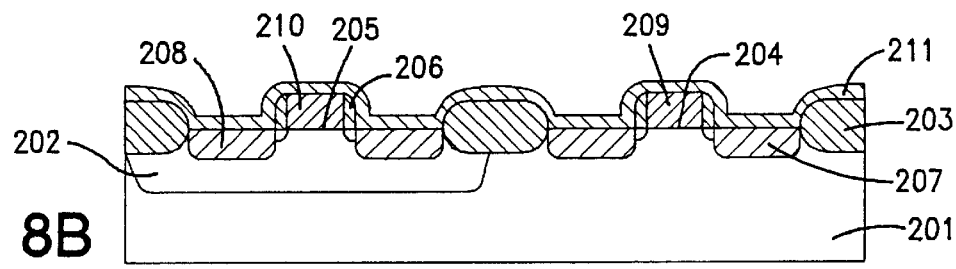

With reference to FIG. 8B, still another ion-implantation mask is formed over the surface region of the n-well region 202 and the gate electrode 205 over the n-well region 202, before ion-implantation of p-type impurity into the surface region of the surface region of the silicon substrate 201 as well as into the gate electrode 205 over the surface region of the silicon substrate 201 are carried out-by self-alignment technique to thereby form an n-type polysilicon gate electrode 209 over the silicon substrate 201 and n-type source/drain diffusion layers 207 in the surface region of the silicon substrate 201. After the still other ion-implantation mask is removed, yet another ion-implantation mask is formed over the surface region of the silicon substrate 201 and the gate electrode 205 over the silicon substrate 201. Ion-implantation of p-type impurity into the n-well region 202 as well as into the gate electrode 205 over the n-well region 202 are carried out by self-alignment technique to thereby form a p-type polysilicon gate electrode 210 over the n-well region 202 and p-type source/drain diffusion layers 208 in the surface region of the n-well region 202. As a modification, it is, of course, possible that the p-type polysilicon gate electrode 210 and the p-type source/drain diffusion layers 208 have been formed before the n-type polysilicon gate electrode 209 and the n-type source/drain diffusion layers 207 are formed. Subsequently, the silicon substrate 201 is subjected to a heat treatment at a temperature of 900° C. for 20 minutes in a nitrogen atmosphere for recovery from crystal defects caused by ion-implantation and for activation of impurity doped thereinto. As a result, n-type source/drain diffusion layers 207 with lightly doped drain structure and p-type source/drain diffusion layers 208 with lightly doped drain structure are formed.

Spontaneous oxide films are removed by diluted fluorine acid solution from surfaces of the n-type and p-type polysilicon gate electrodes 209 and 210 as well as from surfaces of the n-type source/drain diffusion layers 207 and the p-type source/drain diffusion layers 208. Subsequently, a titanium film 211 is entirely deposited by sputtering a target of titanium. The titanium film 211 extends over the field oxide films 203, the n-type and p-type source/drain diffusion layers 207 and 208, the n-type and p-type polysilicon gate electrodes 209 and 210 and the side wall oxide films 206. The titanium film 211 has a thickness of 30 nanometers.

Figure 8C:
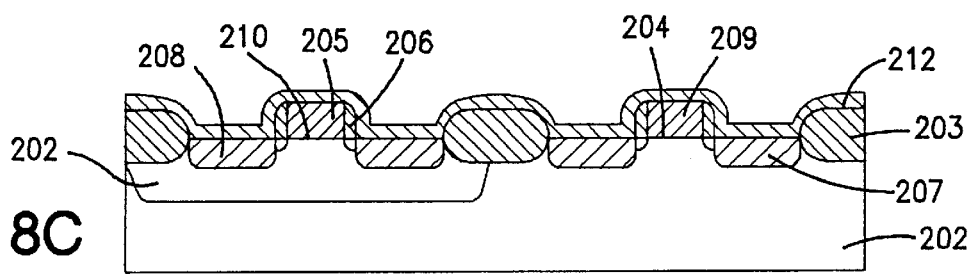

With reference to FIG. 8C, an ion-implantation of tungsten into the titanium film 211 is carried out at a dose in the range of above $3.0 \times 10^{14}$ cm$^{-2}$ to $3.0 \times 10^{15}$ cm$^{-2}$ and at an implantation energy of 10 keV to form a tungsten containing titanium film 212 which is a titanium film containing tungsten at a concentration of tungsten to a total amount of tungsten and titanium in the range of above 1 at % to 10 at %.

Figure 8D:
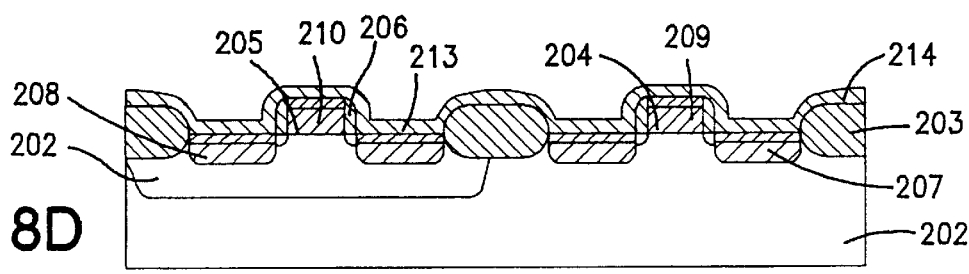

With reference to FIG. 8D, the silicon substrate 201 is subjected to a rapid thermal annealing at a temperature of 690° C. for 30 seconds in a nitrogen atmosphere to cause silicidation reactions. The tungsten containing titanium film 212 in contact with the n-type and p-type source/drain diffusion layers 207 and 208 and the n-type and p-type polysilicon gate electrodes 209 and 210 shows silicidation reactions of titanium and tungsten with silicon or polysilicon. As a result, C49-structured titanium silicide films 213 containing tungsten in the range of above 1 at % to 10 at % in a concentration of tungsten to a total amount of tungsten and titanium in the form of substitutional solid solution are provided in self-alignment or salicidation technique so that the C49-structured tungsten containing titanium silicide films 213 extend over the n-type and p-type source/drain diffusion layers 207 and 208 and the n-type and p-type polysilicon gate electrodes 209 and 210. On the other hand, the tungsten containing titanium film 212 in contact with the field oxide films 203 and the side wall oxide films 206 as well as a surface region of the tungsten containing titanium film 212 show nitration reaction of titanium and tungsten with nitrogen. As a result, a titanium nitride film 214 containing tungsten is provided, which extends over the field oxide films 203 and the side wall oxide films 206 as well as over a surface of the C49-structured tungsten containing titanium silicide film 213.

Figure 8E:
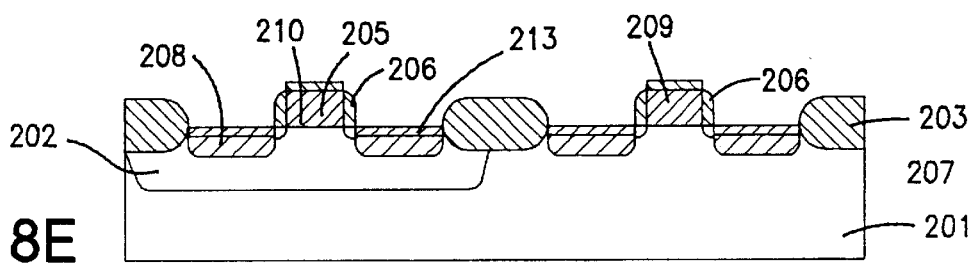

With reference to FIG. 8E, only the tungsten containing titanium nitride films 214 are removed from the field oxide films 203 and the side wall oxide films 206 by a wet etching with a mixing solution of ammonia water and hydrogen peroxide water.

Figure 8F:
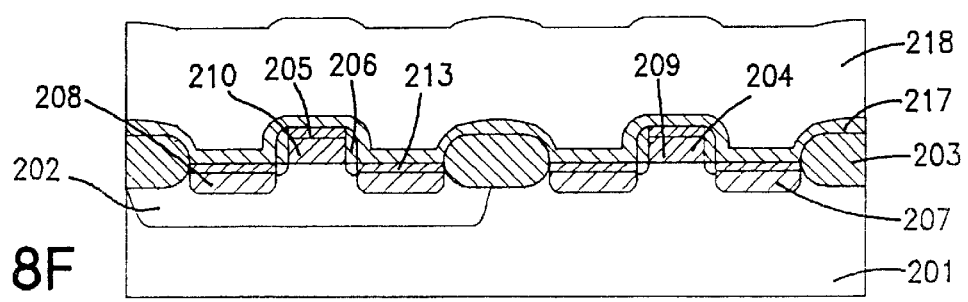

With reference to FIG. 8F, a first inter-layer insulator 217 made of silicon oxide is entirely deposited which extends over the C49-structured tungsten containing titanium silicide films 213, the field oxide films 203 and the side wall oxide films 206. Subsequently, a second inter-layer insulator 218 made of silicon oxide containing impurity such as boron or phosphorus is deposited over the first inter-layer insulator 217. The first and second inter-layer insulators 217 and 218 are annealed by a furnace-anneal at a temperature of 800° C. The C49-structured tungsten containing titanium silicide films 213, however, show no phase transition from C49-structure to C54-structure as being highly heat-resistive. The C49-structured tungsten containing titanium silicide films 213 remain in C49-structure of titanium silicide containing tungsten in substitutional solid solution. The C49-structured tungsten containing titanium silicide films 213 show no variations in thickness and in composition nor deformation. The C49-structured tungsten containing titanium silicide films 213 remain uniform in thickness and in composition. The C49-structured tungsten containing titanium silicide films 213 remain low in sheet resistance.

Third Embodiment

A third embodiment according to the present invention will be described with reference to FIGS. 9A through 9E which are fragmentary cross sectional elevation views illustrative of fabrication processes for fabricating CMOS transistors having a tungsten containing titanium salicide structure over a silicon substrate.

Figure 9A:
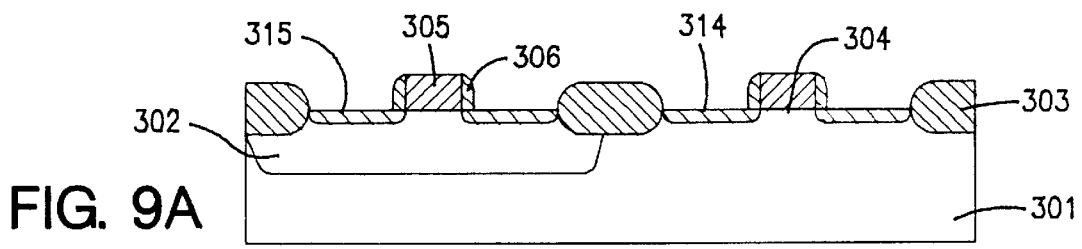

With reference to FIG. 9A, an n-well region 302 is selectively formed in a p-type silicon substrate 301 by an ion-implantation of n-type impurity. Field oxide films 303 are selectively formed on a surface of the silicon substrate 301 by a local oxidation of silicon method. The filed oxide films 303 have a thickness of 300 nanometers. The filed oxide films 303 surround active regions on the n-well region 302 and the surface region of the p-type silicon substrate 301. Gate oxide films 304 are formed on the active regions on the n-well region 302 and the surface region of the p-type silicon substrate 301. The gate oxide films 304 have a thickness of 6 nanometers. A polysilicon film having a thickness of 150 nanometers is entirely formed, which extends over the field oxide films 303 and the gate oxide films 304. The polysilicon film is patterned by a photo-lithography method and a subsequent dry etching method to form gate electrodes 305 on the gate oxide films 304 formed on the active regions on the n-well region 302 and on the surface region of the p-type silicon substrate 301. By use of photo-lithography, an ion-implantation mask is formed over the n-well region 302 before lightly n-doped diffusion layers 314 are formed in the surface region of the silicon substrate 301 by ion-implantation of n-type impurity in self-alignment. The ion-implantation mask is removed and thereafter by use of the photo-lithography, another ion-implantation mask is formed over the surface region of the silicon substrate 301 before lightly p-doped diffusion layers 315 are formed in the surface region of the n-well region 302 by ion-implantation of p-type impurity in self-alignment. The other ion-implantation mask is removed. As a modification, it is, of course, available that the lightly p-doped diffusion layers 315 have been formed before the lightly n-doped diffusion layers 314 are formed. A silicon oxide film having a thickness of 70 nanometers is entirely formed which extends over the filed oxide films 303, the lightly n-doped diffusion layers 314, the lightly p-doped diffusion layers 315 and the gate electrodes 305. The silicon oxide film is then selectively removed by an etch back method to form side wall oxide films 306 at opposite sides of each of the gate electrodes 305.

Figure 9B:
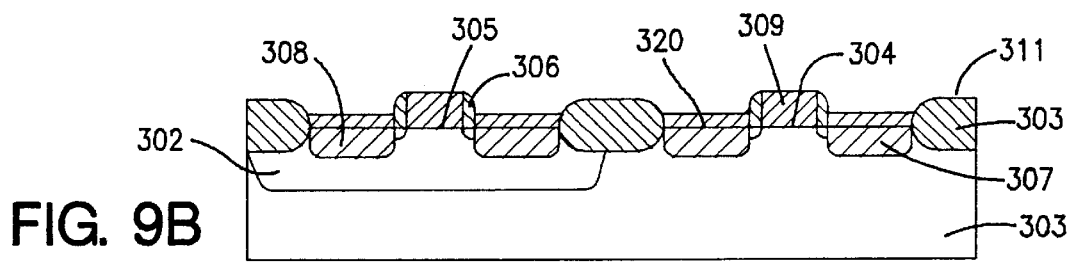

With reference to FIG. 9B, still another ion-implantation mask is formed over the surface region of the n-well region 302 and the gate electrode 305 over the n-well region 302, before ion-implantation of p-type impurity into the surface region of the surface region of the silicon substrate 301 as well as into the gate electrode 305 over the surface region of the silicon substrate 301 are carried out by self-alignment technique to thereby form an n-type polysilicon gate electrode 309 over the silicon substrate 301 and n-type source/drain diffusion layers 307 in the surface region of the silicon substrate 301. After the still other ion-implantation mask is removed, yet another ion-implantation mask is formed over the surface region of the silicon substrate 301 and the gate electrode 305 over the silicon substrate 301. Ion-implantation of p-type impurity into the n-well region 302 as well as into the gate electrode 305 over the n-well region 302 are carried out by self-alignment technique to thereby form a p-type polysilicon gate electrode 310 over the n-well region 302 and p-type source/drain diffusion layers 308 in the surface region of the n-well region 302. As a modification, it is, of course, possible that the p-type polysilicon gate electrode 310 and the p-type source/drain diffusion layers 308 have been formed before the n-type polysilicon gate electrode 309 and the n-type source/drain diffusion layers 307 are formed. Subsequently, the silicon substrate 301 is subjected to a heat treatment at a temperature of 900° C. for 20 minutes in a nitrogen atmosphere for recovery from crystal defects caused by ion-implantation and for activation of impurity doped thereinto. As a result, n-type source/drain diffusion layers 307 with lightly doped drain structure and p-type source/drain diffusion layers 308 with lightly doped drain structure are formed.

An ion-implantation of arsenic ions into upper regions of the n-type and p-type polysilicon gate electrodes 309 and 310 as well as into the n-type and p-type source/drain diffusion layers 307 and 308 is carried out at a dose of $3.0 \times 10^{14}$ cm$^{-2}$ and at an ion-implantation energy of 30 keV thereby to form amorphous silicon layers 320 over the n-type and p-type polysilicon gate electrodes; 309 and 310 as well as over the n-type and p-type source/drain diffusion layers 307 and 308. The amorphous silicon layers 320 have a depth or a thickness of 30 nanometers.

Spontaneous oxide films are removed by diluted fluorine acid solution from surfaces of the amorphous silicon layers 320.

Figure 9C:
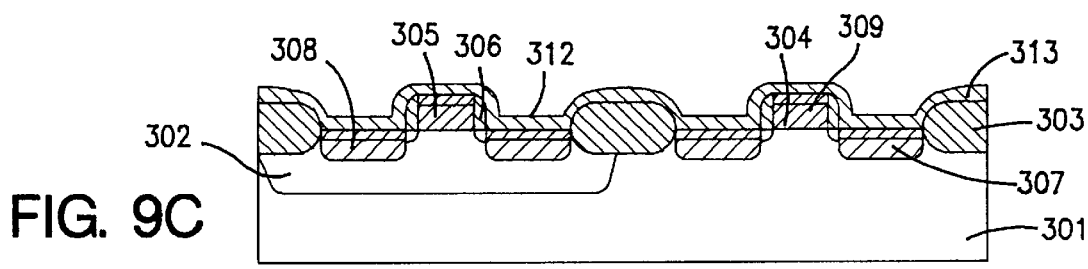

With reference to FIG. 9C, a 5 at % tungsten containing titanium film is entirely deposited by sputtering a target of titanium containing tungsten at a 5 at % concentration of tungsten to a total amount of tungsten and titanium, wherein the silicon substrate 301 is heated at a substrate temperature of 450° C. The 5 at % tungsten containing titanium film extends over the field oxide films 303, the n-type and p-type source/drain diffusion layers 307 and 308, the n-type and p-type polysilicon gate electrodes 309 and 310 and the side wall oxide films 306. The 5 at % tungsten containing titanium film is a titanium film containing tungsten at a 5 at % concentration of tungsten to a total amount of tungsten and titanium. The 5 at % tungsten containing titanium film 311 has a thickness of 30 nanometers. Since the silicon substrate 301 has been heated at a substrate temperature of 450° C., the 5 at % tungsten containing titanium film in contact with the n-type and p-type source/drain diffusion layers 307 and 308 and the n-type and p-type polysilicon gate electrodes 309 and 310 shows silicidation reactions of titanium and tungsten with silicon or polysilicon. As a result, C49-structured titanium silicide films 312 containing tungsten at a 5 at % concentration of tungsten to a total amount of tungsten and titanium in the form of substitutional solid solution are provided in self-alignment or salicidation technique so that the C49-structured 5 at % tungsten containing titanium silicide films 312 extend over the n-type and p-type source/drain diffusion layers 307 and 308 and the n-type and p-type polysilicon gate electrodes 309 and 310. On the other hand, the 5 at % tungsten containing titanium film in contact with the field oxide films 303 and the side wall oxide films 306 as well as a surface region of the 5 at % tungsten containing titanium film show nitration reaction of titanium and tungsten with nitrogen. As a result, a titanium nitride film 313 containing tungsten is provided, which extends over the field oxide films 303 and the side wall oxide films 306 as well as over a surface of the C49-structured 5 at % tungsten containing titanium silicide film 312. The amorphous silicon layers 320 are also made into monocrystal silicon layer and polycrystal silicon layer by the heat treatment at the substrate temperature of 450° C. The silicidation reaction of titanium and tungsten with silicon in amorphous silicon may be caused at such a low temperature as 450° C.

Figure 9D:
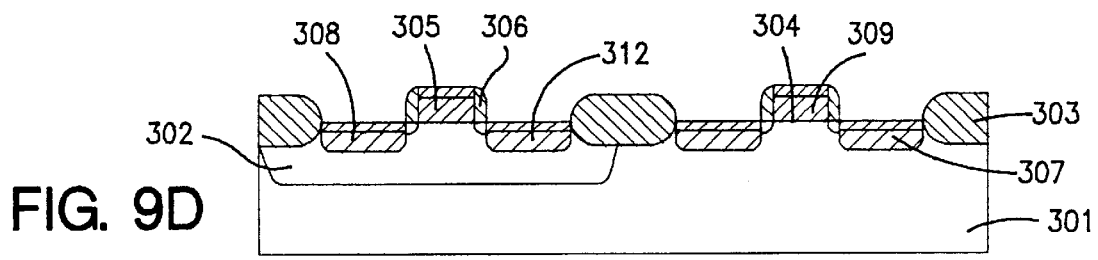

With reference to FIG. 9D, only the tungsten containing titanium nitride films 313 are removed from the field oxide films 303 and the side wall oxide films 306 by a wet etching with a mixing solution of ammonia water and hydrogen peroxide water.

Figure 9E:
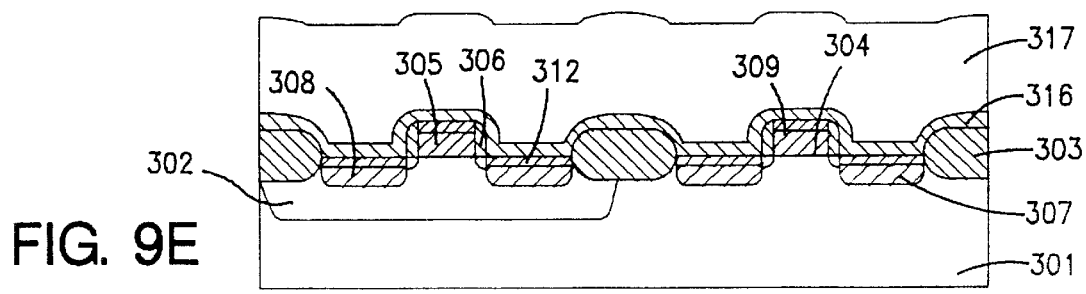

With reference to FIG. 9E, a first inter-layer insulator 316 made of silicon oxide is entirely deposited which extends over the C49-structured 5 at % tungsten containing titanium silicide films 312, the field oxide films 303 and the side wall oxide films 306. Subsequently, a second inter-layer insulator 317 made of silicon oxide containing impurity such as boron or phosphorus is deposited over the first inter-layer insulator 316. The first and second inter-layer insulators 316 and 317 are annealed by a furnace-anneal at a temperature of 800° C. The C49-structured 5 at %-tungsten containing titanium silicide films 312, however, show no phase transition from C49-structure to C54-structure as being highly heat-resistive. The C49-structured 5 at %-tungsten containing titanium silicide films 312 remain in C49-structure of titanium silicide containing tungsten in substitutional solid solution. The C49-structured 5 at %-tungsten containing titanium silicide films 312 show no variations in thickness and in composition nor deformation. The C49-structured 5 at %-tungsten containing titanium silicide films 312 remain uniform in thickness and in composition. The C49-structured 5 at %-tungsten containing titanium silicide films 312 remain low in sheet resistances The C49-structured 5 at %-tungsten containing titanium silicide films 312 of this third embodiment are lower in sheet resistance than that of the first and second embodiment.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming a C49-structured titanium silicide film on silicon, said method comprising the steps of:

forming, on silicon, a titanium film which contains at least a refractory metal having a higher melting point than titanium, wherein a concentration of said refractory metal to a total amount of titanium and said refractory metal is in the range of above 1 at % to not more than 20 at %; and subjecting said titanium film to a heat treatment in an inert gas atmosphere for causing a silicidation reaction, thereby to form a C49-structured titanium silicide film which contains said at least a refractory metal in the form of a substitutional solid solution.

2. The method as claimed in claim 1, wherein said titanium film which contains said at least a refractory metal is formed by the step of:

depositing, on a monocrystal silicon by a sputtering method, a titanium film which contains said at least a refractory metal, wherein a concentration of said refractory metal to a total amount of titanium and said refractory metal is in the range of above 1 at % to not more than 20 at %.

3. The method as claimed in claim 1, wherein said titanium film which contains said at least a refractory metal is formed by the step of:

depositing a titanium film on a monocrystal silicon by a sputtering method; and introducing said at least a refractory metal into said titanium film by an ion-implantation so that a concentration of said refractory metal to a total amount of titanium and said refractory metal is in the range of above 1 at % to not more than 20 at %.

4. The method as claimed in claim 1, wherein said titanium film which contains said at least a refractory metal is formed by the step of:

depositing, on a polycrystal silicon by a sputtering method, a titanium film which contains said at least a refractory metal, wherein a concentration of said refractory metal to a total amount of titanium and said refractory metal is in the range of above 1 at % to not more than 20 at %.

5. The method as claimed in claim 1, wherein said titanium film which contains said at least a refractory metal is formed by the step of:

depositing a titanium film on a polycrystal silicon by a sputtering method; and introducing said at least a refractory metal into said titanium film by an ion-implantation so that a concentration of said refractory metal to a total amount of titanium and said refractory metal is in the range of above 1 at % to not more than 20 at %.

6. The method as claimed in claim 1, wherein said titanium film which contains said at least a refractory metal is subjected to a rapid thermal anneal at a temperature of 690° C. for 30 seconds.

7. The method as claimed in claim 1, wherein said concentration of said refractory metal to said total amount of titanium and said refractory metal is in the range of above 1 at % to not more than 10 at %.

8. The method as claimed in claim 7, wherein said concentration of said refractory metal to said total amount of titanium and said refractory metal is 5 at %.

9. The method as claimed in claim 1, wherein said refractory metal is tungsten.

10. A method of forming a C49-structured titanium silicide film on silicon, said method comprising the step of:

depositing, on an amorphous silicon heated at a temperature of approximately 450° C., a titanium film which contains at least a refractory metal having a higher melting point than titanium, wherein a concentration of said refractory metal to a total amount of titanium and said refractory metal is in the range of above 1 at % to not more than 20 at %, for causing a silicidation reaction and a crystallization of amorphous silicon into silicon, thereby to form, on silicon, a C49-structured titanium silicide film which contains said at least a refractory metal in the form of a substitutional solid solution.

11. The method as claimed in claim 10, wherein said concentration of said refractory metal to said total amount of titanium and said refractory metal is in the range of above 1 at % to not more than 10 at %.

12. The method as claimed in claim 11, wherein said concentration of said refractory metal to said total amount of titanium and said refractory metal is 5 at %.

13. The method as claimed in claim 10, wherein said refractory metal is tungsten.

14. A method of forming a C49-structured titanium silicide film on silicon, said method comprising the steps of:

forming, on silicon, a titanium film which contains at least a refractory metal having a higher melting point than titanium, wherein a concentration of said refractory metal to a total amount of titanium and said refractory metal is in the range of above 1 at % to not more than 20 at %;

subjecting said titanium film to a heat treatment in an inert gas atmosphere for causing a silicidation reaction, thereby to form a C49-structured titanium silicide film which contains said at least a refractory metal in the form of a substitutional solid solution;

depositing an inter-layer insulator on said C49-structured titanium silicide film; and subjecting said inter-layer insulator and said C49-structured titanium silicide film to an anneal at a temperature of not less than 800° C. whereas said C49-structured titanium silicide film has a sheet resistance of not more than 60 $\mu\Omega$cm, and shows no phase transition.

15. The method as claimed in claim 14, wherein said titanium film which contains said at least a refractory metal is formed by the step of:

depositing, on a monocrystal silicon by a sputtering method, a titanium film which contains said at least a refractory metal, wherein a concentration of said refractory metal to a total amount of titanium and said refractory metal is in the range of above 1 at % to not more than 20 at %.

16. The method as claimed in claim 14, wherein said titanium film which contains said at least a refractory metal is formed by the step of:

depositing a titanium film on a monocrystal silicon by a sputtering method; and introducing said at least a refractory metal into said titanium film by an ion-implantation so that a concentration of said refractory metal to a total amount of titanium and said refractory metal is in the range of above 1 at % to not more than 20 at %.

17. The method as claimed in claim 14, wherein said titanium film which contains said at least a refractory metal is formed by the step of:

depositing, on a polycrystal silicon by a sputtering method, a titanium film which contains said at least a refractory metal, wherein a concentration of said refractory metal to a total amount of titanium and said refractory metal is in the range of above 1 at % to not more than 20 at %.

18. The method as claimed in claim 14, wherein said titanium film which contains said at least a refractory metal is formed by the step of:

depositing a titanium film on a polycrystal silicon by a sputtering method; and introducing said at least a refractory metal into said titanium film by an ion-implantation so that a concentration of said refractory metal to a total amount of titanium and said refractory metal is in the range of above 1 at % to not more than 20 at %.

19. The method as claimed in claim 14, wherein said titanium film which contains said at least a refractory metal is subjected to a rapid thermal anneal at a temperature of 690° C. for 30 seconds.

20. The method as claimed in claim 14, wherein a concentration of said refractory metal to a total amount of titanium and said refractory metal is in the range of above 1 at % to not more than 10 at %.

21. The method as claimed in claim 20, wherein said concentration of said refractory metal to said total amount of titanium and said refractory metal is 5 at %.

22. The method as claimed in claim 14, wherein said refractory metal is tungsten.

23. A method of forming a C49-structured titanium silicide film on silicon, said method comprising the steps of:

depositing, on an amorphous silicon heated at a temperature of approximately 450° C., a titanium film which contains at least a refractory metal having a higher melting point than titanium, for causing a silicidation reaction and a crystallization of amorphous silicon into silicon, thereby to form, on silicon, a C49-structured titanium silicide film which contains said at least a refractory metal in the form of a substitutional solid solution;

depositing an inter-layer insulator on said C49-structured titanium silicide film; and subjecting said inter-layer insulator and said C49-structured titanium silicide film to an anneal at a temperature of not less than 800° C. whereas said C49-structured titanium silicide film has a sheet resistance of not more than 60 $\mu\Omega$cm, and shows no phase transition.

24. The method as claimed in claim 23, wherein said concentration of said refractory metal to said total amount of titanium and said refractory metal is in the range of above 1 at % to not more than 10 at %.

25. The method as claimed in claim 24, wherein said concentration of said refractory metal to said total amount of titanium and said refractory metal is 5 at %.

26. The method as claimed in claim 23, wherein said refractory metal is tungsten.

27. A method of forming a C49-structured titanium silicide film on silicon, said method comprising the steps of:

forming, on silicon, a titanium film which contains at least a refractory metal having a higher melting point than titanium, wherein a concentration of said refractory metal to a total amount of titanium and said refractory metal is not more than 20 at %;

subjecting said titanium film to a heat treatment in an inert gas atmosphere for causing a silicidation reaction, thereby to form a C49-structured titanium silicide film which contains said at least a refractory metal in the form of a substitutional solid solution;

depositing an inter-layer insulator on said C49-structured titanium silicide film; and subjecting said inter-layer insulator and said C49-structured titanium silicide film to an anneal at a temperature of not less than 800° C. whereas said C49-structured titanium silicide film shows no phase transition.

28. The method as claimed in claim 27, wherein said titanium film which contains said at least a refractory metal is formed by the step of:

depositing, on a monocrystal silicon by a sputtering method, a titanium film which contains said at least a refractory metal, wherein a concentration of said refractory metal to a total amount of titanium and said refractory metal is in the range of above 1 at % to not more than 20 at %.

29. The method as claimed in claim 27, wherein said titanium film which contains said at least a refractory metal is formed by the step of:

depositing a titanium film on a monocrystal silicon by a sputtering method; and introducing said at least a refractory metal into said titanium film by an ion-implantation so that a concentration of said refractory metal to a total amount of titanium and said refractory metal is in the range of above 1 at % to not more than 20 at %.

30. The method as claimed in claim 27, wherein said titanium film which contains said at least a refractory metal is formed by the step of:

depositing, on a polycrystal silicon by a sputtering method, a titanium film which contains said at least a refractory metal, wherein a concentration of said refractory metal to a total amount of titanium and said refractory metal is in the range of above 1 at % to not more than 20 at %.

31. The method as claimed in claim 27, wherein said titanium film which contains said at least a refractory metal is subjected to a rapid thermal anneal at a temperature of 690° C. for 30 seconds.

32. The method as claimed in claim 27, wherein said concentration of said refractory metal to said total amount of titanium and said refractory metal is in the range of above 1 at % to not more than 10 at %.

33. The method as claimed in claim 32, wherein said concentration of said refractory metal to said total amount of titanium and said refractory metal is 5 at %.

34. The method as claimed in claim 27, wherein said refractory metal is tungsten.

35. A method of forming a C49-structured titanium silicide film on silicon, said method comprising the steps of:

depositing, on an amorphous silicon heated at a temperature of approximately 450° C., a titanium film which contains at least a refractory metal having a higher melting point than titanium, wherein a concentration of said refractory metal to a total amount of titanium and said refractory metal is not more than 20 at %, for causing a silicidation reaction and a crystallization of amorphous silicon into silicon, thereby to form, on silicon, a C49-structured titanium silicide film which contains said at least a refractory metal in the form of a substitutional solid solution;

depositing an inter-layer insulator on said C49-structured titanium silicide film; and subjecting said inner-layer insulator and said C49-structured titanium silicide film to an anneal at a temperature of not less than 800° C. whereas said C49-structured titanium silicide film shows no phase transition.

36. The method as claimed in claim 35, wherein said concentration of said refractory metal to said total amount of titanium and said refractory metal is in the range of above 1 at % to not more than 10 at %.

37. The method as claimed in claim 36, wherein said concentration of said refractory metal to said total amount of titanium and said refractory metal is 5 at %.

38. The method as claimed in claim 35, wherein said refractory metal is tungsten.

39. A method of forming a titanium salicide structure over a silicon substrate, said method comprising the steps of:

selectively forming thick insulation films over a silicon substrate so that said thick insulation films surround an active region of said silicon substrate;

forming a gate insulation film on said active region of said silicon substrate;

forming a polysilicon gate electrode on said gate insulation film;

forming source drain diffusion regions self-aligned in said silicon substrate;

forming side wall insulation films at opposite sides of said polysilicon gate electrode;

depositing a titanium film which extends over said thick insulation film, said side wall insulation films, said polysilicon gate electrode and said source/drain diffusion regions, said titanium film which contains at least a refractory metal having a higher melting point than titanium, wherein a concentration of said refractory metal to a total amount of titanium and said refractory metal is in the range of above 1 at % to not more than 10 at %;

subjecting said titanium film to a heat treatment at a temperature of 690° C. in an inert gas atmosphere for causing a silicidation reaction, thereby to form a first C49-structured titanium silicide film self-aligned on said polysilicon gate electrode and second C49-structured titanium silicide films self-aligned on said source/drain diffusion regions whilst said titanium film extending over said thick insulation films and said side wall insulation films shows no silicidation reaction as well as a part of said titanium film extending over said polysilicon gate electrode and said source/drain diffusion regions shows no silicidation reaction;

removing by a wet-etching said titanium film having shown no silicidation reaction;

depositing an inter-layer insulator which extends over said first and second C49-structured titanium silicide films, said thick insulation films and said side wall insulation films; and subjecting said inter-layer insulator and said first and second C49-structured titanium silicide films to an anneal at a temperature of nor less than 800° C. whereas each of said first and second C49-structured titanium silicide films has a sheet resistance of not more than 60 μΩcm, and shows no phase transition.

40. The method as claimed in claim 39, wherein said concentration of said refractory metal to said total amount of titanium and said refractory metal is 5 at %.

41. The method as claimed in claim 39, wherein said refractory metal is tungsten.

42. The method as claimed in claim 39, wherein each of said first and second C49-structured titanium silicide films has a sheet resistance of not more than 50 μΩcm.

43. A method of forming a titanium salicide structure over a silicon substrate, said method comprising the steps of:

selectively forming thick insulation films over a silicon substrate so that said thick insulation films surround an active region of said silicon substrate;

forming a gate insulation film on said active region of said silicon substrate;

forming a polysilicon gate electrode on said gate insulation film;

forming source drain diffusion regions self-aligned in said silicon substrate;

forming side wall insulation films at opposite sides of said polysilicon gate electrode;

forming amorphous silicon layers in upper regions of said polysilicon gate electrode and said source/drain diffusion regions by an ion-implantation of an impurity having the same conductivity type of said source/drain diffusion regions and said polysilicon gate electrode into said upper regions;

depositing a titanium film which extends over said thick insulation film, said side wall insulation films and said amorphous silicon layers at a substrate temperature of approximately 450° C. for causing a silicidation reaction, wherein said titanium film which contains at least a refractory metal having a higher melting point than titanium, and wherein a concentration of said refractory metal to a total amount of titanium and said refractory metal is in the range of above 1 at % to not more than 10 at %, thereby to form a first C49-structured titanium silicide film self-aligned on said polysilicon gate electrode and second C49-structured titanium silicide films self-aligned on said source/drain diffusion regions whilst said titanium film extending over said thick insulation films and said side wall insulation films shows no silicidation reaction as well as a part of said titanium film extending over said polysilicon gate electrode and said source/drain diffusion regions shows no silicidation reaction;

removing by a wet-etching said titanium film having shown no silicidation reaction;

depositing an inter-layer insulator which extends over said first and second C49-structured titanium silicide films, said thick insulation films and said side wall insulation films; and subjecting said inter-layer insulator and said first and second C49-structured titanium silicide films to an anneal at a temperature of not less than 800° C. whereas each of said first and second C49-structured titanium silicide films has a sheet resistance of not more than 60 μΩcm, and shows no phase transition.

44. The method as claimed in claim 43, wherein said concentration of said refractory metal to said total amount of titanium and said refractory metal is 5 at %.

45. The method as claimed in claim 43, wherein said refractory metal is tungsten.

46. The method as claimed in claim 43, wherein each of said first and second C49-structured titanium silicide films has a sheet resistance of not more than 50 μΩcm.

47. A method of forming a titanium salicide structure over a silicon substrate, said method comprising the steps of:

selectively forming thick insulation films over a silicon substrate so that said thick insulation films surround an active region of said silicon substrate;

forming a gate insulation film on said active region of said silicon substrate;

forming a polysilicon gate electrode on said gate insulation film;

forming source drain diffusion regions self-aligned in said silicon substrate;

forming side wall insulation films at opposite sides of said polysilicon gate electrode;

depositing a titanium film which extends over said thick insulation film, said side wall insulation films, said polysilicon gate electrode and said source/drain diffusion regions, an ion-implantation of at least a refractory metal having a higher melting point than titanium into said titanium film so that said titanium film contains said at least a refractory metal, wherein a concentration of said refractory metal to a total amount of titanium and said refractory metal is in the range of above 1 at % to not more than 10 at %;

subjecting said titanium film to a heat treatment at a temperature of 690° C. in an inert gas atmosphere for causing a silicidation reaction, thereby to form a first C49-structured titanium silicide film self-aligned on said polysilicon gate electrode and second C49-structured titanium silicide films self-aligned on said source/drain diffusion regions whilst said titanium film extending over said thick insulation films and said side wall insulation films shows no silicidation reaction as well as a part of said titanium film extending over said polysilicon gate electrode and said source/drain diffusion regions shows no silicidation reaction;

removing by a wet-etching said titanium film having shown no silicidation reaction;

depositing an inter-layer insulator which extends over said first and second C49-structured titanium silicide films, said thick insulation films and said side wall insulation films; and subjecting said inter-layer insulator and said first and second C49-structured titanium silicide films to an anneal at a temperature of nor less than 800° C. whereas each of said first and second C49-structured titanium silicide films has a sheet resistance of not more than 60 μΩcm, and shows no phase transition.

48. The method as claimed in claim 47, wherein said concentration of said refractory metal to said total amount of titanium and said refractory metal is 5 at %.

49. The method as claimed in claim 47, wherein said refractory metal is tungsten.

50. The method as claimed in claim 47, wherein each of said first and second C49-structured titanium silicide films has a sheet resistance of not more than 50 μΩcm.

* * * * *